(12) United States Patent
Kawai et al.

(10) Patent No.: US 10,444,101 B2
(45) Date of Patent: Oct. 15, 2019

(54) SENSOR DEVICE, FORCE DETECTION DEVICE, AND ROBOT

(71) Applicant: Seiko Epson Corporation, Tokyo (JP)

(72) Inventors: Hiroki Kawai, Matsumoto (JP); Hideo Miyasaka, Okaya (JP)

(73) Assignee: Seiko Epson Corporation (JP)

( * ) Notice: Subject to any disclaimer, the term of this patent is extended or adjusted under 35 U.S.C. 154(b) by 33 days.

(21) Appl. No.: 15/911,711

(22) Filed: Mar. 5, 2018

(65) Prior Publication Data

US 2018/0252604 A1 Sep. 6, 2018

(30) Foreign Application Priority Data

Mar. 6, 2017 (JP) ................................ 2017-041359
Jan. 19, 2018 (JP) ................................ 2018-007032

(51) Int. Cl.

| G01L 5/00 | (2006.01) |
|---|---|
| G01L 5/16 | (2006.01) |
| B25J 19/02 | (2006.01) |
| H01L 41/187 | (2006.01) |
| G01L 5/22 | (2006.01) |
| B25J 13/08 | (2006.01) |
| H01L 41/113 | (2006.01) |

(Continued)

(52) U.S. Cl.
CPC ............. *G01L 5/167* (2013.01); *B25J 13/085* (2013.01); *B25J 19/028* (2013.01); *G01L 5/226* (2013.01); *H01L 41/1132* (2013.01); *H01L 41/18* (2013.01); *H01L 41/187* (2013.01); *H01L 41/313* (2013.01)

(58) Field of Classification Search
CPC ........ G01L 5/167; G01L 5/226; B25J 13/085; B25J 19/028; H01L 41/1132; H01L 41/18; H01L 41/187; H01L 41/313
USPC .......................................................... 73/862
See application file for complete search history.

(56) References Cited

U.S. PATENT DOCUMENTS 6,321,600 B1 * 11/2001 Hirose ................ G01P 15/0922
73/514.01
7,352,116 B2 * 4/2008 Nakao .................. H01G 4/0085
310/328

(Continued)

FOREIGN PATENT DOCUMENTS

JP 2015-087292 A 5/2015

*Primary Examiner* — Max H Noori
*Assistant Examiner* — Masoud H Noori
(74) *Attorney, Agent, or Firm* — Harness, Dickey & Pierce, P.L.C.

(57) ABSTRACT

A sensor device includes: a base having a recess; a force detecting element which is provided in the recess, and includes at least one piezoelectric element that outputs a signal in accordance with an external force; an adhesive which is provided between the force detecting element and a bottom surface of the recess; at least one electrode provided in the force detecting element; at least one terminal provided in the base; and at least one conductive paste which electrically connects the electrode and the terminal to each other, in which the conductive paste has a part that overlaps the adhesive when viewed from a direction in which the force detecting element and the bottom surface overlap each other, and in which the force detecting element overlaps the bottom surface when viewed from the direction in which the force detecting element and the bottom surface overlap each other.

20 Claims, 14 Drawing Sheets

(51) Int. Cl.
*H01L 41/18* (2006.01)
*H01L 41/313* (2013.01)

(56) References Cited

U.S. PATENT DOCUMENTS

| | | | |
|---|---|---|---|
| 2015/0120051 A1* | 4/2015 | Matsuzawa | H01L 41/1132 700/258 |
| 2018/0283965 A1* | 10/2018 | Matsuzawa | G01L 5/0061 |
| 2018/0283966 A1* | 10/2018 | Matsuzawa | G01L 5/0061 |

* cited by examiner

SENSOR DEVICE, FORCE DETECTION DEVICE, AND ROBOT

BACKGROUND

1. Technical Field

The present invention relates to a sensor device, a force detection device, and a robot.

2. Related Art

From the related art, in an industrial robot having an end effector and a robot arm, a force detection device for detecting a force applied to the end effector is used.

As an example of such a force detection device, for example, JP-A-2015-87292 discloses a sensor device including: a base portion having a recess portion; a laminated body having a piezoelectric layer and an electrode provided in the recess portion; a side electrode provided on a side surface of the laminated body; a terminal provided on the base portion; and a connection electrode which connects the terminal and the side electrode. In addition, the connection electrode is formed of Ag paste or the like, and the base portion is formed of Kovar.

In the sensor device disclosed in JP-A-2015-87292, the laminated body is fixed to the base portion as the connection electrode connects the side electrode and the terminal to each other. Therefore, the sensor device has low resistance with respect to mechanical stress, such as vibration. In addition, when connecting the laminated body to the terminal by the connection electrode, there is a concern that the Ag paste which is the base material of the connection electrode drips to a bottom surface of the recess portion before being cured. As a result, there is a concern that a short circuit is generated due to contact of the connection electrode formed of Ag paste with the base portion formed of Kovar. Furthermore, for example, when disposing the laminated body in the recess portion, it is necessary to use a positioning jig or the like to position the laminated body on the inside of the recess portion, and thus, there is a problem that much labor is required such as disposition and detachment of the jig to and from the recess portion when manufacturing the jig.

SUMMARY

An advantage of some aspects of the invention is to solve at least a part of the problems described above, and the invention can be implemented as follows.

A sensor device according to an aspect of the invention includes: a base having a recess; a force detecting element which is provided in the recess, and includes at least one piezoelectric element that outputs a signal in accordance with an external force; an adhesive which is provided between the force detecting element and a bottom surface of the recess, and has insulating properties; at least one electrode provided in the force detecting element; at least one terminal provided in the base; and at least one conductive paste which electrically connects the electrode and the terminal to each other, in which the conductive paste has a part that overlaps the adhesive when viewed from a direction in which the force detecting element and the bottom surface overlap each other, the bottom surface has a part made of metal, and the force detecting element overlaps the part made of the metal on the bottom surface when viewed from the direction in which the force detecting element and the bottom surface overlap each other.

According to the sensor device according to the aspect of the invention, since it is possible to adhere the force detecting element to the bottom surface of the recess by the adhesive, it is possible to enhance stability of the position of the force detecting element in the recess. Therefore, it is possible to reduce deterioration of resistance against mechanical stress, such as vibration. As a result, it is possible to output the signal that corresponds to the external force with high accuracy, and thus, to improve the detection accuracy of the external force.

In addition, for example, it is possible to electrically connect the force detecting element to the circuit (external force detection circuit) which calculates a detection result (electric charge) output from the force detecting element through the electrode, a conductive paste, and a terminal.

In addition, it is possible to reduce or prevent the conductive paste from coming into contact with the bottom surface. Therefore, for example, in a case where the bottom surface is made of a material having conductivity, it is possible to prevent a short circuit due to the contact between the conductive paste and the bottom surface.

In addition, it is possible to enhance mechanical strength, such as brittleness of the bottom surface.

In addition, it is possible to reduce or avoid occurrence of damage, such as cracks, on the bottom surface, for example, due to a load from the force detecting element on the bottom surface.

In addition, it is possible to reduce or prevent a short circuit due to contact between the bottom surface and the force detecting element, for example, even in a case where the bottom surface of the recess and a surface on the base side of the force detecting element have conductivity.

In the sensor device, it is preferable that the adhesive includes inorganic fillers.

Accordingly, it is possible to use the inorganic filler as a cap material that regulates the distance between the force detecting element and the bottom surface, and to enhance uniformity of the thickness of the adhesive positioned between the force detecting element and the bottom surface. In addition, by using the inorganic filler, it is possible to enhance mechanical strength of the adhesive.

In the sensor device according to the aspect of the invention, it is preferable that the inorganic filler includes a first filler and a second filler, and the maximum diameter of the first filler is greater than the maximum diameter of the second filler.

With this configuration, it is easy to control the thickness of the adhesive to a desired thickness, and it is possible to control characteristics of the resin material. In other words, the first filler functions as a cap material that regulates the distance between the force detecting element and the bottom surface of the recess, and easily controls the thickness of the adhesive to a desired thickness by using the first filler. In addition, it is possible to adjust the viscosity of the adhesive before being cured and the mechanical characteristics of the adhesive after being cured by using the second filler.

In the sensor device according to the aspect of the invention, it is preferable that the adhesive is a cured product of a liquid adhesive.

With this configuration, for example, it is possible to reduce or avoid entrance of bubbles between the force detecting element and the bottom surface, and to enhance the adhesive strength by the adhesive between the force detecting element and the bottom surface.

In the sensor device according to the aspect of the invention, it is preferable that a part of the adhesive is positioned between the force detecting element and a side surface of the recess.

With this configuration, it is possible to further stably position the force detecting element in the recess. In addition, for example, in a case where the bottom surface of the recess is configured to include a metal material, it is possible to prevent a short circuit due to the contact between the adhesive and the bottom surface.

In the sensor device according to the aspect of the invention, it is preferable that the force detecting element has a base material which supports the piezoelectric element and adheres to the adhesive, and the part positioned between the force detecting element of the adhesive and the side surface of the recess is positioned closer to the bottom surface side than the piezoelectric element provided on the base material.

With this configuration, for example, it is possible to reduce or prevent the adhesive from adhering to, for example, the electrode (side electrode) provided in the force detecting element or the terminal provided in the base.

In the sensor device according to the aspect of the invention, it is preferable that a lid which blocks an opening of the recess is further provided.

With this configuration, it is possible to accommodate the force detecting element in a space formed in the base and the lid, and to airtightly seal the inside of the space. Therefore, it is possible to reduce deterioration of the detection accuracy due to an external factor of the force detecting element.

In the sensor device according to the aspect of the invention, it is preferable that at least a part of the lid overlaps the force detecting element when viewed from the direction in which the force detecting element and the bottom surface overlap each other.

With this configuration, it is possible to dispose the force detecting element between the base and the lid. Therefore, for example, it is possible to reduce deterioration of robustness by pressurizing the force detecting element from both of the base and the lid. As a result, it is possible to further reduce deterioration of the detection accuracy of the force detecting element.

In the sensor device according to the aspect of the invention, it is preferable that the piezoelectric element includes quartz crystal.

With this configuration, it is possible to realize a force detection device having excellent characteristics, such as high sensitivity, wide dynamic range, and high rigidity.

A force detection device according to another aspect of the invention includes: a first board; a second board; the sensor device provided between the first board and the second board; and an external force detection circuit which detects the external force based on the signal from the sensor device, in which the sensor device includes: a base having a recess; a force detecting element which is provided in the recess, and includes at least one piezoelectric element that outputs a signal in accordance with an external force; an adhesive which is provided between the force detecting element and a bottom surface of the recess, and has insulating properties; at least one electrode provided in the force detecting element; at least one terminal provided in the base; and at least one conductive paste which electrically connects the electrode and the terminal to each other, in which the conductive paste has a part that overlaps the adhesive when viewed from a direction in which the force detecting element and the bottom surface overlap each other, in which the bottom surface has a part made of metal, and in which the force detecting element overlaps the part made of the metal on the bottom surface when viewed from the direction in which the force detecting element and the bottom surface overlap each other.

According to the force detection device, it is possible to detect the external force with high accuracy. A robot according to still another aspect of the invention includes a support base; an arm which is connected to the support base; and the force detection device, in which the force detection device includes: a first board; a second board; the sensor device provided between the first board and the second board; and an external force detection circuit which detects the external force based on the signal from the sensor device, in which the sensor device includes: a base having a recess; a force detecting element which is provided in the recess, and includes at least one piezoelectric element that outputs a signal in accordance with an external force; an adhesive which is provided between the force detecting element and a bottom surface of the recess, and has insulating properties; at least one electrode provided in the force detecting element; at least one terminal provided in the base; and at least one conductive paste which electrically connects the electrode and the terminal to each other, in which the conductive paste has a part that overlaps the adhesive when viewed from a direction in which the force detecting element and the bottom surface overlap each other, in which the bottom surface has a part made of metal, and in which the force detecting element overlaps the part made of the metal on the bottom surface when viewed from the direction in which the force detecting element and the bottom surface overlap each other.

According to the robot, it is possible to perform work more precisely.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
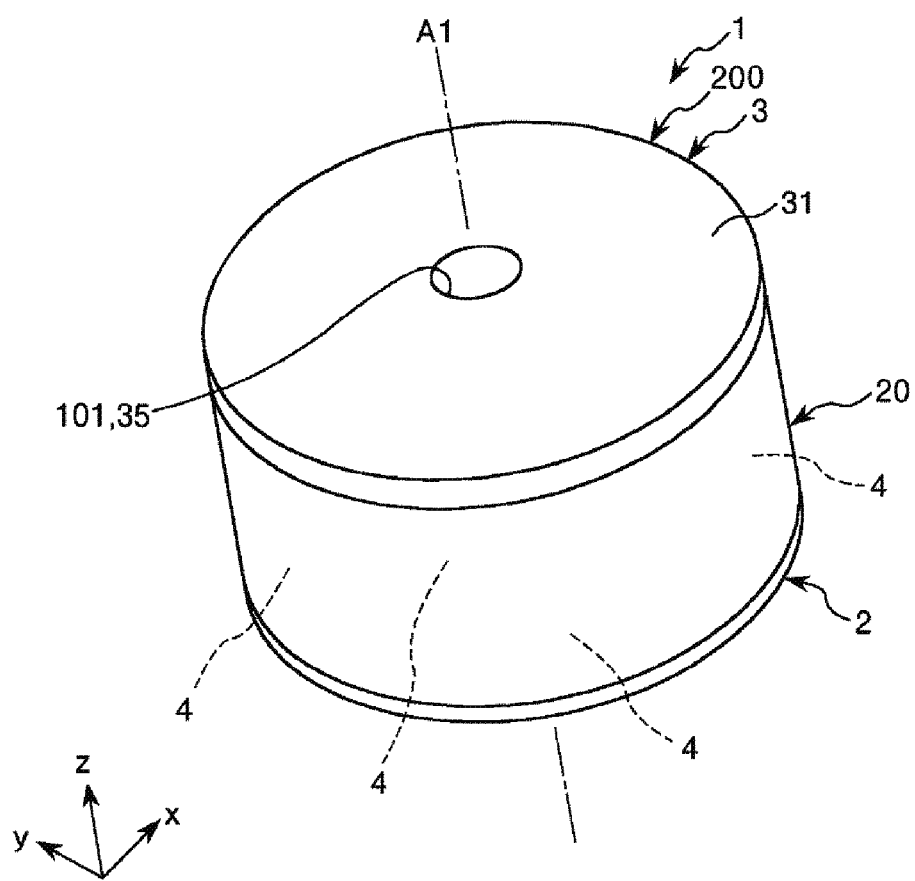
FIG. 1 is a perspective view illustrating a force detection device including a sensor device according to an appropriate embodiment of the invention.

Hereinafter, a sensor device, a force detection device, and a robot according to the invention will be described in detail based on preferred embodiments illustrated in the attached drawings. In addition, in the drawings, the parts to be described are displayed as being appropriately enlarged or reduced so as to achieve a state where the parts can be recognized.

1. Force Detection Device

First, the force detection device according to the invention will be described.

Figure 2:
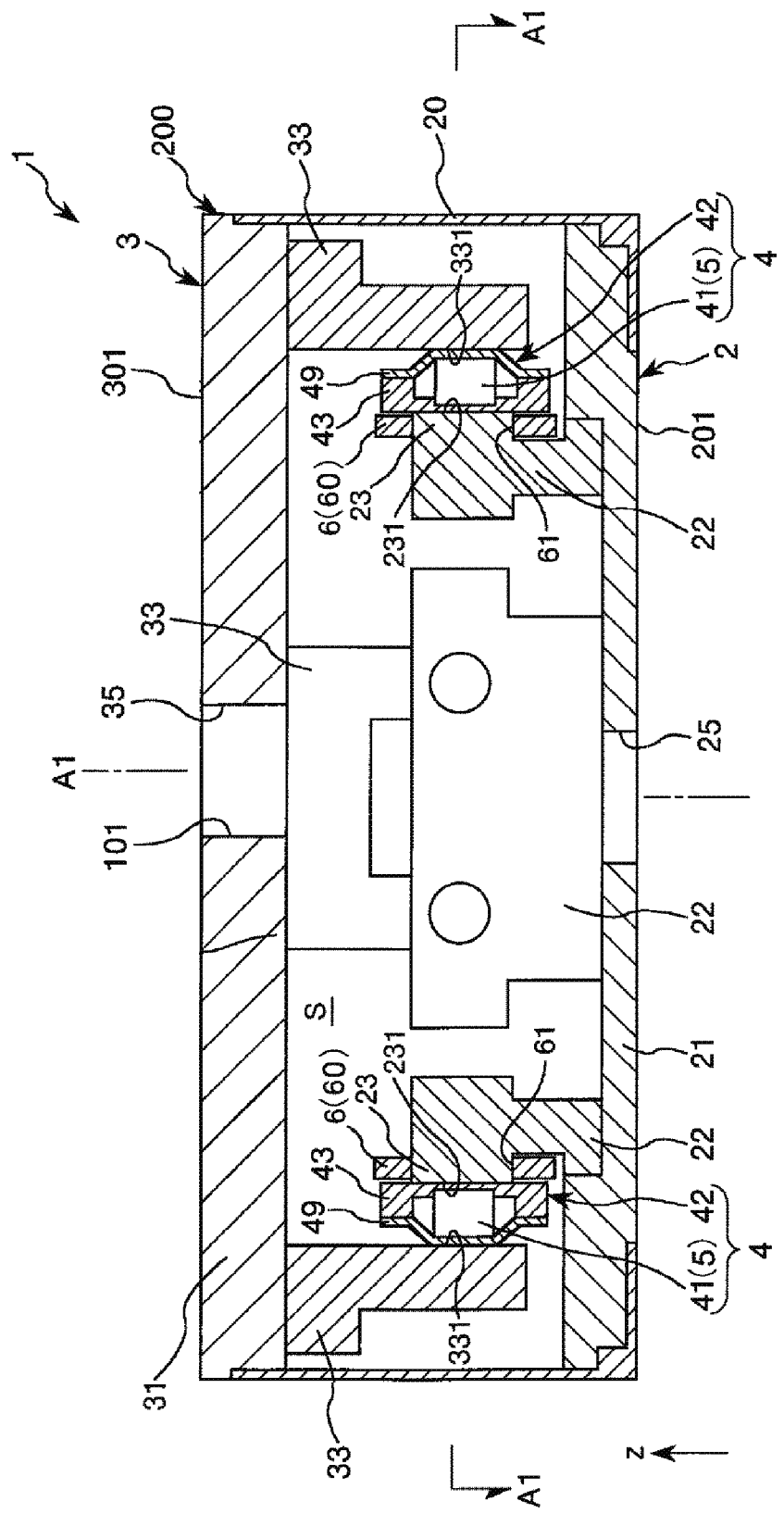
FIG. 2 is a longitudinal sectional view of the force detection device illustrated in FIG. 1.
Figure 3:
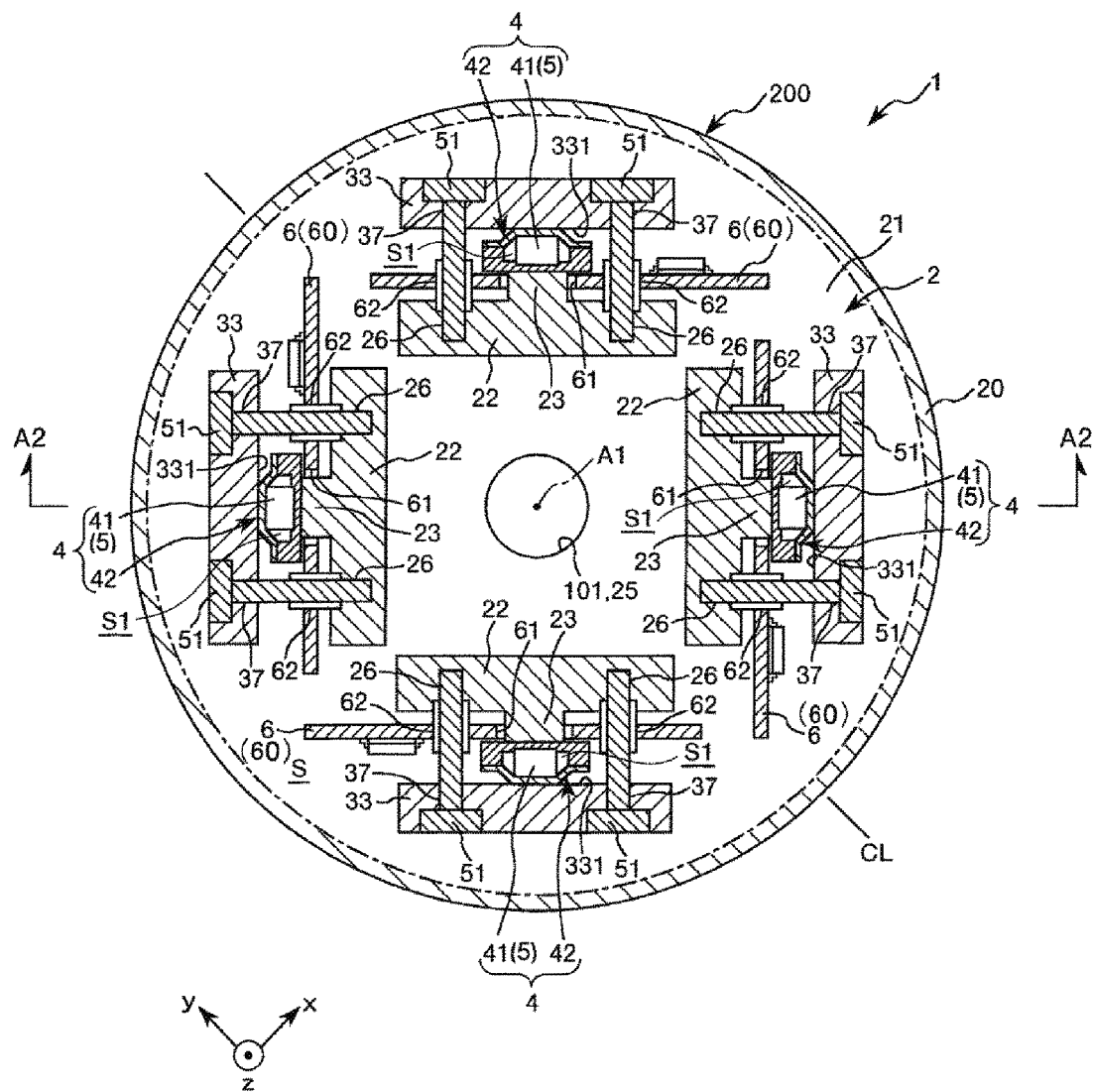
FIG. 3 is a horizontal sectional view of the force detection device illustrated in FIG. 2.
Figure 4:
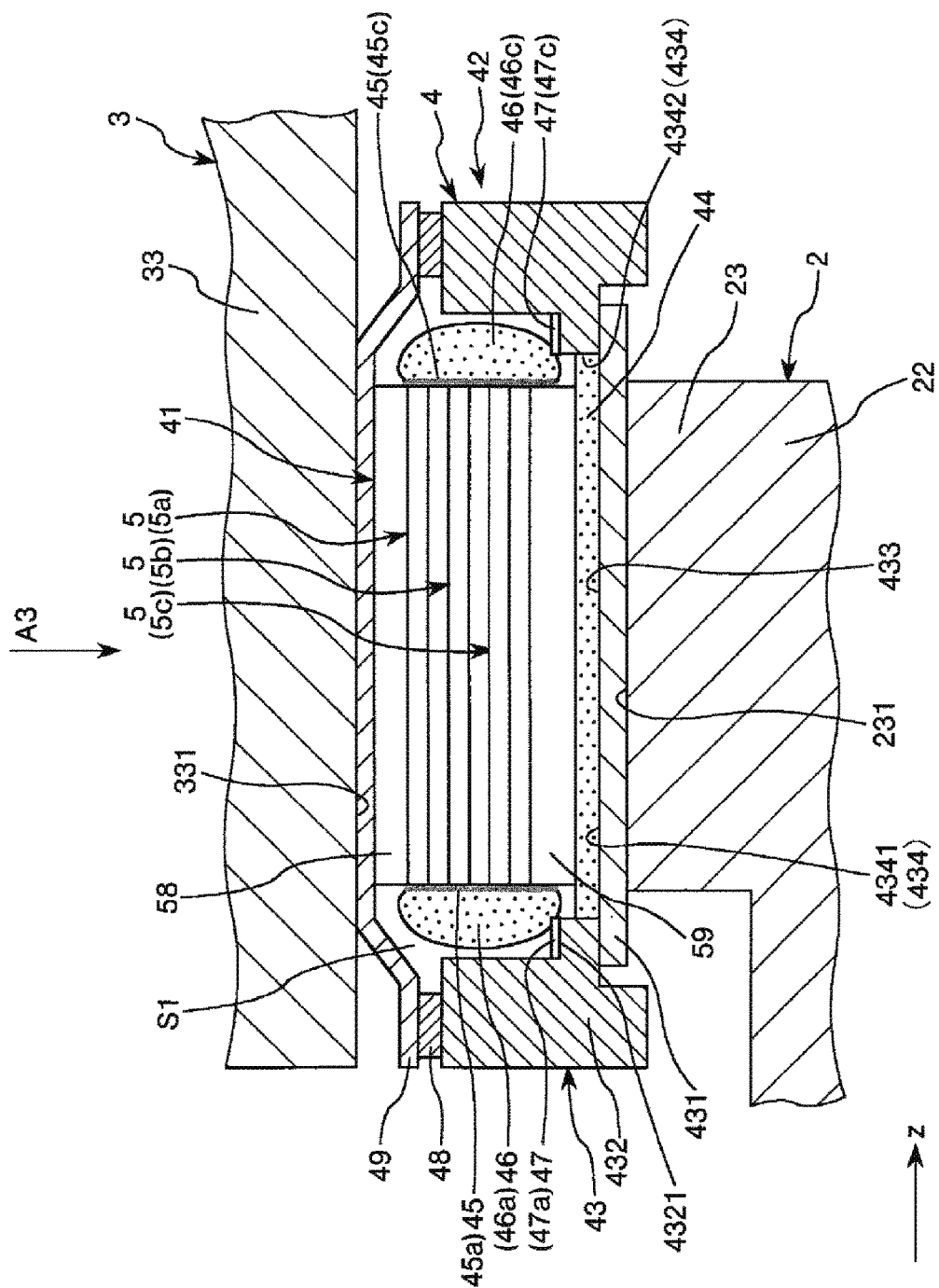
FIG. 4 is a sectional view of the sensor device included in the force detection device illustrated in FIGS. 2 and 3.
Figure 5:
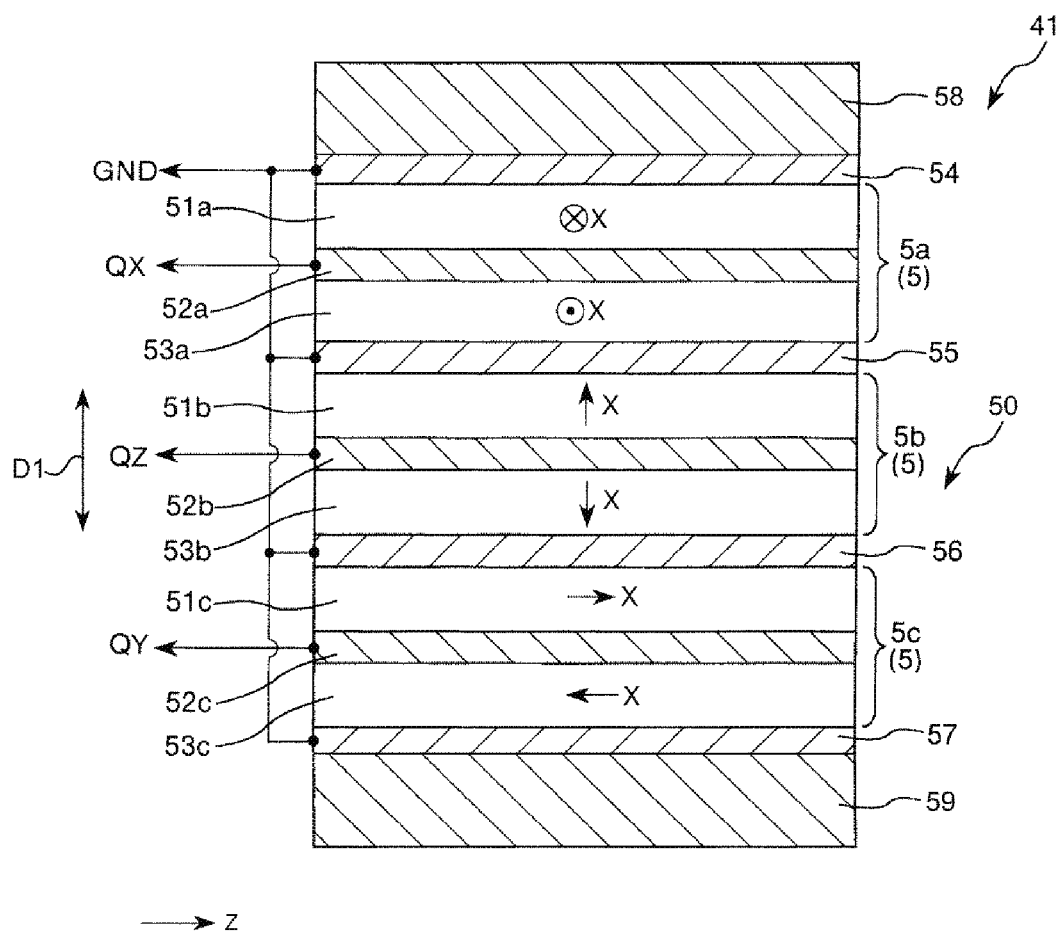
FIG. 5 is a sectional view of a force detecting element included in the sensor device illustrated in FIG. 4.
Figure 6:
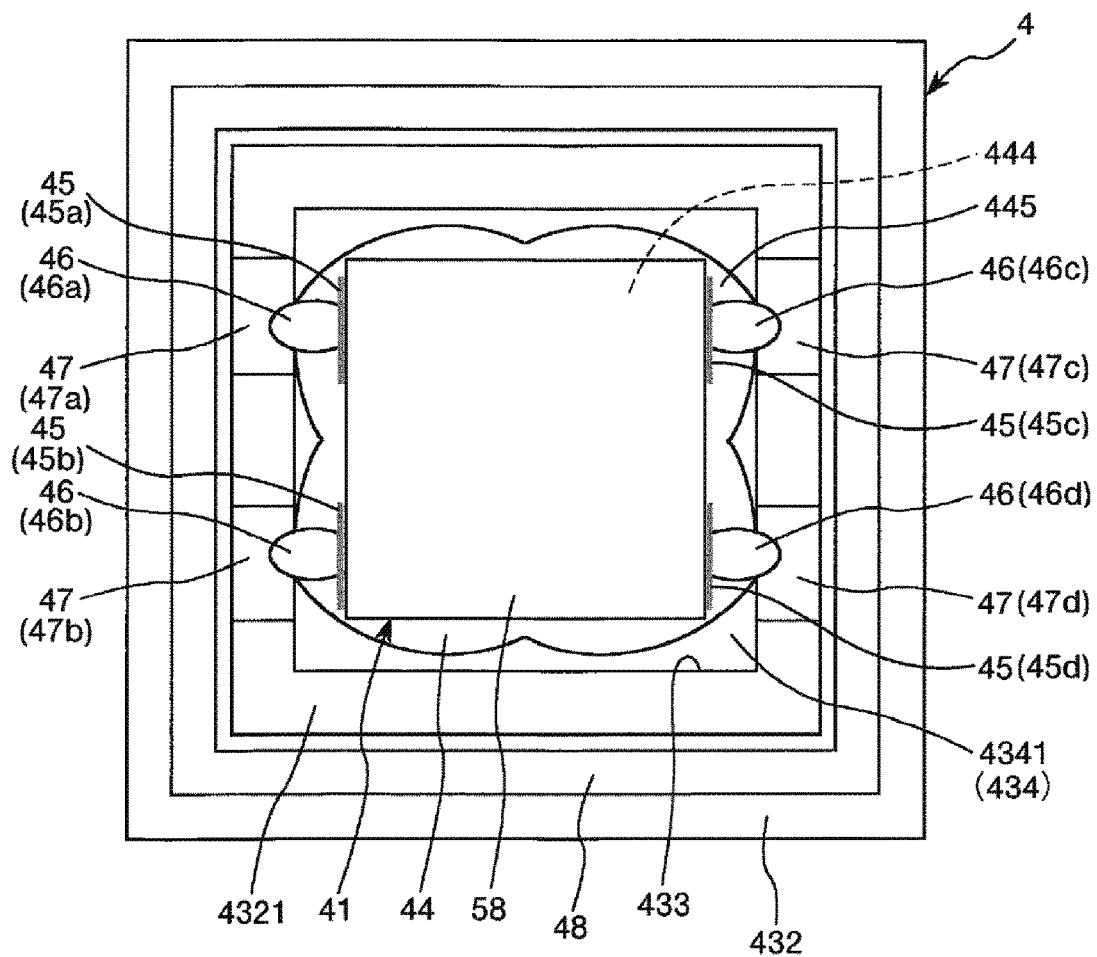
FIG. 6 is a view of the inside of the sensor device illustrated in FIG. 4 when viewed from a lamination direction.
Figure 7:
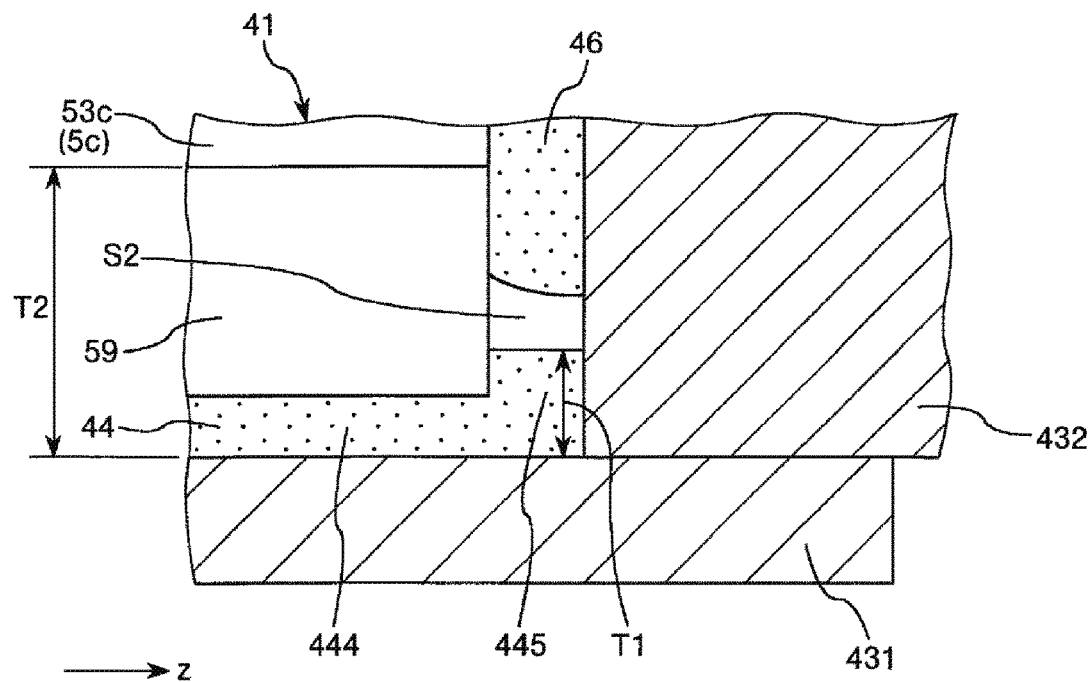
FIG. 7 is an enlarged view of a part of the sensor device illustrated in FIG. 4.
Figure 8:
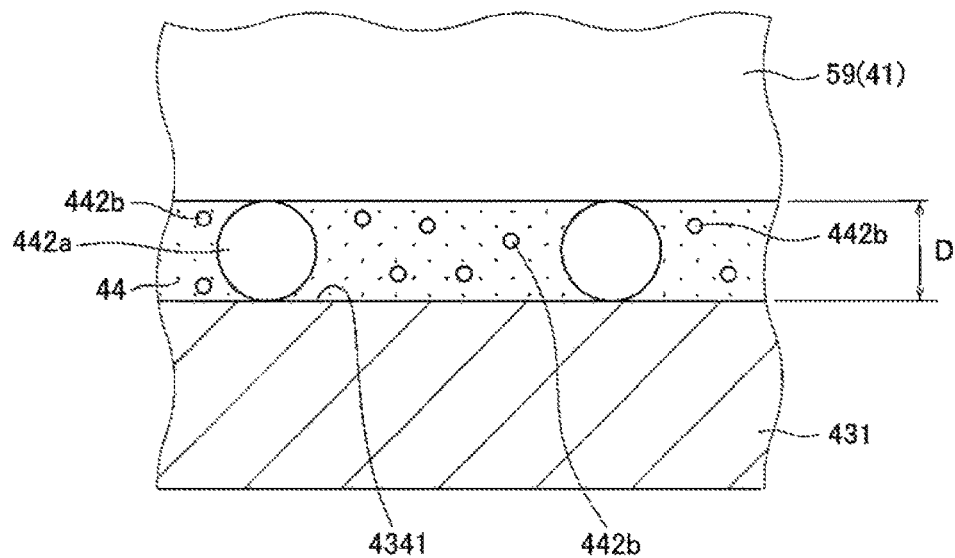
FIG. 8 is a view schematically illustrating an adhesive member included in the sensor device illustrated in FIG. 4.
Figure 9:
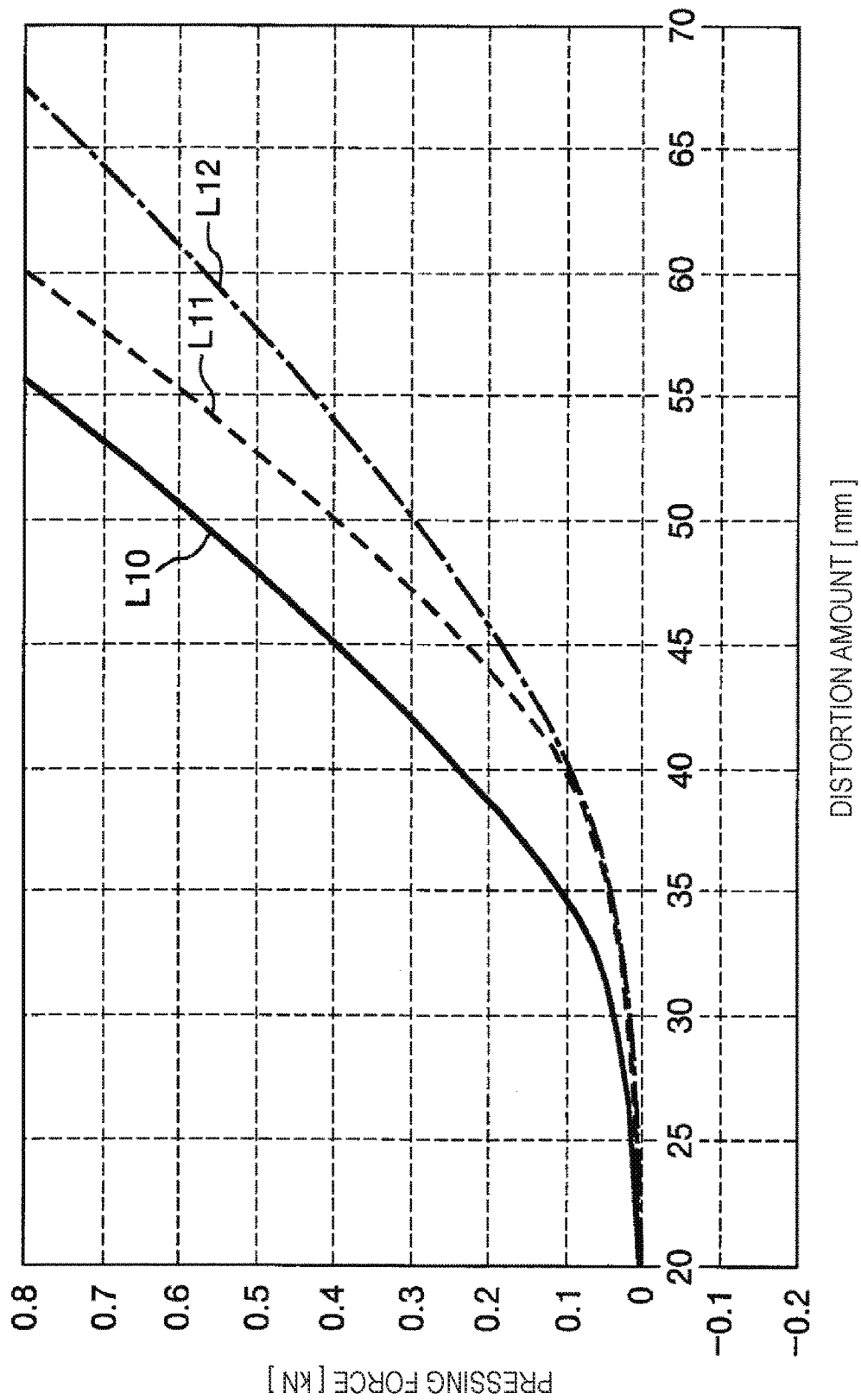
FIG. 9 is a view illustrating a relationship between the thickness of an adhesive member of the sensor device illustrated in FIG. 4 and a strain amount.

FIG. 1 is a perspective view illustrating a force detection device including a sensor device according to an appropriate embodiment of the invention. FIG. 2 is a longitudinal sectional view of the force detection device illustrated in FIG. 1. FIG. 3 is a horizontal sectional view of the force detection device illustrated in FIG. 2. FIG. 4 is a sectional view of the sensor device included in the force detection device illustrated in FIGS. 2 and 3. FIG. 5 is a sectional view of a force detecting element included in the sensor device illustrated in FIG. 4. FIG. 6 is a view of the inside of the sensor device illustrated in FIG. 4 when viewed from a lamination direction. FIG. 7 is an enlarged view of a part of the sensor device illustrated in FIG. 4. FIG. 8 is a view schematically illustrating an adhesive member included in the sensor device illustrated in FIG. 4. FIG. 9 is a view illustrating a relationship between the thickness of an adhesive member of the sensor device illustrated in FIG. 4 and a strain amount. In addition, FIG. 2 is a sectional view taken along line A2-A2 in FIG. 3, and FIG. 3 is a sectional view taken along line A1-A1 in FIG. 2. In addition, in FIG. 4, illustration of an analog circuit board 6 is omitted. In addition, in FIG. 8, a ratio of dimensions of a filler 442a and a filler 442b is different from the actual ratio.

In addition, for convenience of the description, in FIG. 1, an x-axis, a y-axis, and a z-axis are illustrated as three axes orthogonal to each other, and a tip end side of the arrow indicating each axis is "+", a base end side is "−". In addition, a direction parallel to the x-axis is referred to as "x-axis direction", a direction parallel to the y-axis as "y-axis direction", and a direction parallel to the z-axis as "z-axis direction". In addition, the +z-axis direction side is also referred to as "up", and the −z-axis direction side is referred to as "down". In addition, what is seen from the z-axis direction is referred to as "planar view".

The force detection device 1 illustrated in FIG. 1 is a six-axis force sensor which is capable of detecting six-axis components of an external force applied to the force detection device 1. Here, the six-axis component includes a translational force (shearing force) component in each direction of three mutually orthogonal axes (the x-axis, the y-axis, and the z-axis in the drawing), and a rotational force (moment) component around the axes of each of the three axes.

As illustrated in FIGS. 1 to 3, the force detection device 1 includes a plurality (four in this embodiment) of sensor devices 4 having at least one (plural) piezoelectric elements 5, and a case 200 which accommodates a plurality of sensor devices 4 therein. In addition, the force detection device 1 also has a through-hole 101 formed along a center axis A1 thereof. In addition, as illustrated in FIG. 3, the force detection device 1 includes a plurality (eight in the embodiment) of pressurizing bolts 51, a plurality of (four in the embodiment) analog circuit boards 6, and a digital circuit board (not illustrated).

In the force detection device 1, signals (detection results) which corresponds to the external forces received by each of the sensor devices 4 are output, and the signals are processed by the analog circuit board 6 and the digital circuit board (not illustrated). Accordingly, the six-axis component of the external force applied to force detection device 1 is detected. Here, in the embodiment, the analog circuit board 6 and the digital circuit board (not illustrated) configure an external force detection circuit 60 which detects the external force based on the signal from the sensor device 4.

Hereinafter, each part of the force detection device 1 will be described below.

Case

As illustrated in FIG. 1, the case 200 includes a first case member 3; a second case member 2 disposed with an interval with respect to the first case member 3; and a side wall portion 20 (third case member) provided on the outer circumferential portion of the first case member 3 and the second case member 2.

First Case Member

As illustrated in FIG. 2, the first case member 3 includes a top plate 31 (a first base portion), and a plurality of wall portions 33 (first pressurizing portion) provided on the lower side of the top plate 31 and in the outer circumferential portion. Although the outer shape of the first case member 3 in a plan view is circular as illustrated in FIG. 1, not being limited thereto, for example, a polygon, such as a quadrangle or a pentagon, or an ellipse, may be employed.

As illustrated in FIG. 2, the top plate 31 has a shape of a substantially flat plate. On the lower side of the top plate 31, a plurality (four in the embodiment) of wall portions 33 are erected toward the second case member 2 side. In addition, in the drawing, each of the wall portions 33 is formed as a separate member from the top plate 31 and fixed to the top plate 31, but may be integrally formed with the top plate 31. As illustrated in FIG. 3, the plurality of wall portions 33 are arranged at equivalent angular (90°) intervals along the same circumference around a center axis A1 of the force detection device 1. In each of the wall portions 33, a plurality of through-holes 37 through which the pressurizing bolt 51 that will be described later is inserted are formed. In addition, as illustrated in FIG. 2, the inner wall surface 331 (inner end surface) of each of the wall portions 33 is a plane perpendicular to the top plate 31.

In addition, the first case member 3 has a through-hole 35 formed along the central axis A1 at the center portion thereof.

An upper surface 301 of the first case member 3 having such a configuration functions, for example, as an attachment surface to be attached to an end effector 17 (attached member) included in a robot 100 which will be described later.

In addition, the configuration material of the first case member 3 is not particularly limited, but metal materials, such as aluminum or stainless steel, ceramics and the like can be employed.

Second Case Member

As illustrated in FIG. 2, the second case member 2 includes a bottom plate 21 (second base portion), and a plurality of wall portions 22 (second pressurizing portion) provided on the upper side of the bottom plate 21. Although the outer shape of the second case member 2 in a plan view is circular as illustrated in FIG. 1, not being limited thereto, for example, a polygon, such as a quadrangle or a pentagon, or an ellipse, may be employed.

As illustrated in FIG. 2, the bottom plate 21 has a shape of a substantially flat plate. On the upper side of the bottom plate 21, a plurality (four in the embodiment) of wall portions 22 are erected toward the first case member 3 side. In addition, in the drawing, each of the wall portions 22 is formed as a separate member from the bottom plate 21 and fixed to the bottom plate 21, but may be integrally formed with the bottom plate 21. As illustrated in FIG. 3, the plurality of wall portions 22 are arranged at equivalent angular (90°) intervals along the same circumference around a center axis A1 of the force detection device 1. Each of the wall portions 22 is disposed on the center axis A1 side with respect to the wall portion 33 of the above-described first case member 3, and faces the wall portion 33. In addition, on the wall portion 33 side of the wall portion 22, apart 23 which protrudes toward the wall portion 33 side is provided. A top surface 231 of the protruding part 23 faces the inner wall surface 331 of the wall portion 33 at a predetermined distance (distance in which the sensor device 4 can be inserted). In addition, the top surface 231 and the inner wall surface 331 are parallel to each other. In addition, a plurality of female screw holes 26 are formed in each of the wall portions 22 so that a tip end portion of the pressurizing bolt 51 which will be described later is screwed thereto.

In addition, the second case member 2 has a through-hole 25 formed along the central axis A1 at the center portion thereof.

A lower surface 201 of the second case member 2 functions as, for example, an arm attachment surface for attaching the force detection device 1 to an arm 16 of the robot 100 which will be described later.

In addition, the configuration material of the second case member 2 is not particularly limited, but similar to the above-described first case member 3, metal materials, such as aluminum or stainless steel, ceramics and the like can be employed. In addition, the configuration material of the second case member 2 may be the same as or different from the configuration material of the first case member 3.

Side Wall Portion

As illustrated in FIG. 1, the side wall portion 20 (third case member) has a cylindrical shape, and the upper end portion and the lower end portion thereof are screwed to the first case member 3 and the second case member 2, respectively, and is fixed by fitting or the like. In addition, as illustrated in FIG. 2, in a space S surrounded by the side wall portion 20, the top plate 31 of the first case member 3, and the bottom plate 21 of the second case member 2, which are described above, that is, the inner space of the force detection device 1, a plurality of sensor devices 4 are accommodated.

In addition, the configuration material of the side wall portion 20 is not particularly limited, but similar to the above-described first case member 3 or second case member 2, for example, metal materials, such as aluminum or stainless steel, ceramics and the like can be employed. In addition, the configuration material of the side wall portion 20 may be the same as or different from the configuration material of the first case member 3 or the second case member 2.

Sensor Device

As illustrated in FIG. 3, the four sensor devices 4 are disposed so as to be symmetrical to a line segment CL that passes through the center axis A1 and is parallel to the y-axis when viewed from the direction along the center axis A1 (z-axis direction). In addition, when viewed from a direction orthogonal to the center axis A1 (in a side view in FIG. 2), each of the sensor devices 4 is positioned in an intermediate portion between the top plate 31 of the first case member 3 and the bottom plate 21 of the second case member 2. In addition, as illustrated in FIG. 4, each of the sensor devices 4 is disposed between the wall portion 33 of the first case member 3 and the wall portion 22 of the second case member 2. In addition, each of the sensor devices 4 is sandwiched between the wall portion 33 and the wall portion 22.

Each of the sensor devices 4 has a force detecting element 41 (force detecting unit), a package 42 that accommodates the force detecting element 41, and an adhesive member 44 that adheres to the force detecting element 41 to the package 42. In addition, each of the sensor devices 4 includes: a plurality of (four in the embodiment) side electrodes 45 (electrodes) provided in the force detecting element 41; a plurality of (four in the embodiment) terminals 47 provided in the package 42; and a plurality of (four in the embodiment) connecting portions 46 which electrically connects the side electrode 45 and the terminal 47 to each other.

Force Detecting Element

The force detecting element 41 illustrated in FIG. 5 has a function of outputting an electric charge QX that corresponds to a component in the X-axis direction of the external force applied to the force detecting element 41, an electric charge QY that corresponds to the component in the Y-axis direction of the external force applied to the force detecting element 41, and an electric charge QZ that corresponds to the component in the Z-axis direction of the external force applied to the force detecting element 41. The force detecting element 41 includes: a piezoelectric element 5a which outputs the electric charge QX in accordance with the external force (shearing force) parallel to the X-axis; a piezoelectric element 5b which outputs the electric charge QZ in accordance with the external force (compression/tensile force) parallel to the Z-axis; a piezoelectric element 5c which outputs the electric charge QY in accordance with the external force (shearing force) parallel to the Y-axis; and ground electrode layers 54, 55, 56, and 57 which are electrically connected to a reference potential (for example, ground potential GND). In addition, the force detecting element 41 has support substrates 58 and 59 (base material) for supporting a structure body 50 including the piezoelectric elements 5a, 5b, and 5c and the ground electrode layers 54, 55, 56, and 57. Here, the support substrate 58, the ground electrode layer 54, the piezoelectric element 5a, the ground electrode layer 55, the piezoelectric element 5b, the ground electrode layer 56, the piezoelectric element 5c, the ground electrode layer 57, and the support substrate 59 are laminated in this order. In addition, hereinafter, each of the piezoelectric elements 5a, 5b, and 5c is also referred to as a "piezoelectric element 5".

The piezoelectric element 5a is configured by laminating a piezoelectric layer 51a, an output electrode layer 52a, and a piezoelectric layer 53a in this order. Similarly, the piezoelectric element 5b has piezoelectric layers 51b and 53b, and an output electrode layer 52b disposed therebetween. In addition, the piezoelectric element 5c has piezoelectric layers 51c and 53c, and an output electrode layer 52c disposed therebetween.

The piezoelectric element 5 includes quartz crystal. In other words, the piezoelectric element 5 includes the piezoelectric layers 51a, 53a, 51b, 53b, 51c, and 53c formed of quartz crystal. Accordingly, it is possible to realize the force detection device 1 having excellent characteristics, such as high sensitivity, wide dynamic range, and high rigidity.

As illustrated in FIG. 5, in the piezoelectric element 5, the direction of the X-axis which is a crystal axis of quartz crystal that configures the piezoelectric layers 51a, 53a, 51b, 53b, 51c, and 53c varies. In other words, the X-axis of the quartz crystal that configures the piezoelectric layer 51a faces a far side of the paper surface in FIG. 5. The X-axis of the quartz crystal that configures the piezoelectric layer 53a faces a near side of the paper surface in FIG. 5. The X-axis of the quartz crystal that configures the piezoelectric layer 51b faces an upper side in FIG. 5. The X-axis of the quartz crystal that configures the piezoelectric layer 53b faces a lower side in FIG. 5. The X-axis of the quartz crystal that configures the piezoelectric layer 51c faces a right side in FIG. 5. The X-axis of the quartz crystal that configures the piezoelectric layer 53c faces a left side in FIG. 5. Each of the piezoelectric layers 51a, 53a, 51c, and 53c is formed of a Y-cut quartz crystal plate, and the X-axis directions are different from each other by 90 degrees. In addition, each of the piezoelectric layers 51b and 53b is configured of an X-cut quartz crystal plate, and the directions of the X-axis are different from each other by 180°.

In addition, in the embodiment, each of the piezoelectric layers 51a, 53a, 51b, 53b, 51c, and 53c is made of quartz crystal, respectively, but may be configured by using a piezoelectric material other than quartz crystal. Examples of the piezoelectric materials other than quartz crystal include topaz, barium titanate, lead titanate, lead titanate zirconate (PZT: $Pb(Zr,Ti)O_3$), lithium niobate, lithium tantalate and the like.

In addition, materials which configure the output electrode layers 52a, 52b, and 52c and the ground electrode layers 54, 55, 56, and 57 are not particularly limited as long as the materials can each function as an electrode, and examples thereof include nickel, gold, titanium, aluminum, copper, iron, chromium, an alloy containing these, and the like, and one type or two or more types of these can be used in combination (for example, by laminating).

In addition, in the embodiment, each of the support substrates 58 and 59 is configured of quartz crystal, but may be made of a material having no conductivity other than quartz crystal.

Although the overall shape of the force detecting element 41 is a rectangular parallelepiped, not being limited thereto, for example, a cylindrical shape or another polyhedron may be employed. In addition, each of the force detecting elements 41 is disposed so that a lamination direction D1 of the piezoelectric elements 5a, 5b, and 5c is orthogonal to the center axis A1 (in the plane direction of the yz plane) (refer to FIGS. 4 and 5). In addition, in the embodiment, for example, the support substrate 58 is positioned on the wall portion 33 side and the support substrate 59 is positioned on the wall portion 22 side. In addition, the support substrate 58 may be positioned on the wall portion 22, and the support substrate 59 may be positioned on the wall portion 33 side.

In addition, as described above, the force detecting element 41 includes a plurality of piezoelectric elements 5. Accordingly, it is possible to increase the sensitivity of the force detection device 1, and to achieve multiaxial detection axes. In addition, the number of piezoelectric elements 5 and piezoelectric layers which configure the force detecting element 41 is not limited to the above-mentioned number. For example, the number of piezoelectric layers included in one piezoelectric element 5 may be one or three or more, or the number of piezoelectric elements 5 may be two or four or more.

Here, in the embodiment, as described above, each of the sensor devices 4 is disposed so that the lamination direction D1 of the piezoelectric element 5 is orthogonal to the center axis A1, and the four sensor devices 4 are disposed to be symmetrical to each other with respect to the line segment CL (refer to FIGS. 3 and 5). In addition, as described above, the wall portion 33 and the wall portion 22 apply a pressure in a direction parallel to the lamination direction D1 of the piezoelectric element 5. Therefore, in the digital circuit board, it is possible to calculate translational force components Fx, Fy, and Fz and rotational force components Mx, My, and Mz (that is, external forces) without using the electric charge QZ that is likely to receive influence of the temperature fluctuation. Therefore, the force detection device 1 is less likely to receive influence of temperature fluctuations, and high-precision detection is possible. Accordingly, for example, the force detection device 1 is placed under a high temperature environment, the first case member 3 and the second case member 2 thermally expands, and a case where the pressure applied to the piezoelectric element 5 changes from a predetermined value due to the thermal expansion, and becomes noise component, can be reduced or set to be zero.

Package

As illustrated in FIG. 4, the package 42 includes: a base portion 43 (supporting member, first member, and base) having a recess portion 433 (recess) in which the force detecting element 41 is installed; and a lid body 49 (member, second member, and lid) joined to the base portion 43 via a seal member 48 so as to close an opening of the recess portion 433. In addition, the force detecting element 41 including at least one piezoelectric element 5 is installed (accommodated) in a space S1 (internal space of the package 42) surrounded by the base portion 43 and the lid body 49, that is, within the recess portion 433. Accordingly, the force detecting element 41 can be protected. Here, the base portion 43 abuts against the top surface 231 of the above-described second case member 2. Meanwhile, the lid body 49 abuts against the inner wall surface 331 of the above-described first case member 3.

Base Portion

The base portion 43 has a flat plate-like bottom member 431 and a side wall member 432 joined (fixed) to the bottom member 431. The recess portion 433 is formed by the bottom member 431 and the side wall member 432.

The bottom member 431 abuts against the top surface 231 of the second case member 2 and the force detecting element 41, and has a function of transmitting the external force applied to the second case member 2 to the force detecting element 41.

The side wall member 432 has a rectangular tubular shape, and has a protrusion portion 4320 that protrudes toward the inside of the recess portion 433. The protrusion portion 4320 is formed over the entire circumference of the side wall member 432 (formed in an annular shape) and adheres onto the bottom member 431. In addition, a terminal 47 is provided on the surface of the protrusion portion 4320 on the lid body 49 side, that is, a step portion 4321. In addition, the step portion 4321 is formed over the entire circumference of the side wall member 432, and surrounds the outer edge portion of the base portion 43.

An inner wall surface 434 (surface on which the recess portion 433 is formed) of the base portion 43 is configured with a bottom surface 4341 and a side surface 4342. The bottom surface 4341 is configured with the upper surface of the bottom member 431 in FIG. 4. The side surface 4342 is configured with the inner wall surface 434 of the side wall member 432 including the step portion 4321. On the bottom surface 4341, the force detecting element 41 is provided via the adhesive member 44.

In addition, examples of the configuration material of the bottom member 431 of the base portion 43 include various metal materials, such as stainless steel, Kovar, copper, iron, carbon steel, titanium and the like, and among these, Kovar is particularly preferable. Accordingly, the bottom member 431 has relatively high rigidity and is elastically deformed appropriately when stress is applied. Therefore, the bottom member 431 can accurately transmit the external force applied to the second case member 2 to the force detecting element 41, and it is possible to further reduce the damage due to the external force. In addition, Kovar is also preferable from the viewpoint of excellent moldability.

In addition, it is preferable that the bottom member 431 is configured of a single material. Accordingly, it is possible to equalize the longitudinal elastic modulus and the mechanical strength over the entire bottom member 431. In addition, when viewed from a direction of the arrow A3 (lamination direction D1) (a normal line direction of the bottom surface 4341 of the bottom member 431 of the base portion 43) in FIG. 4, at least a region that overlaps with the force detecting element 41 of the base portion 43 is configured of a metal material, and accordingly, it is possible to remarkably achieve an effect of further reducing damage of the base portion 43 due to the external force.

Meanwhile, as a configuration material of the side wall member 432 of the base portion 43, it is preferable to use a material having insulating properties, and for example, various ceramics, such as oxide-based ceramic (for example, alumina or zirconia), carbide-based ceramics (for example, silicon carbide), nitride-based ceramics (for example, silicon nitride) or the like, are preferable as main components. Ceramics have appropriate rigidity and excellent insulating properties. Therefore, damage due to deformation of the package 42 hardly occurs, and the force detecting element 41 accommodated therein can be protected more reliably. In addition, it is possible to more reliably avoid short-circuiting between the terminals 47. In addition, the processing accuracy of the side wall member 432 can be further enhanced.

In addition, it is preferable that the side wall member 432 is configured of a single material. Accordingly, it is possible to equalize the longitudinal elastic modulus and the mechanical strength over the entire bottom member 431. In addition, in the configuration illustrated in the drawing, the bottom member 431 and the side wall member 432 are provided by joining (fixing) separate members, but the bottom member 431 and the side wall member 432 may be integrally formed.

Sealing Member

As illustrated in FIG. 4, the seal member 48 is disposed at the entire circumference of the upper surface of the base portion 43. As the configuration material of the seal member 48, any material may be used as long as the material has a function of joining (adhering) the lid body 49 to the base portion 43, for example, gold, silver, titanium, aluminum, copper, iron, or alloy of these materials can be used.

Lid Body

The lid body 49 has a shape of a plate, and is joined to the base portion 43 via the seal member 48 so as to close the opening of the recess portion 433. The lid body 49 is provided to abut against the wall portion 33 of the first case member 3 and the force detecting element 41, and has a function of transmitting the external force applied to the first case member 3 to the force detecting element 41. In addition, in the embodiment, the edge portion side of the lid body 49 is bent toward the base portion 43 side, and is provided so as to cover the force detecting element 41.

The configuration material of the lid body 49 is not particularly limited, but similar to the above-described bottom member 431, examples thereof can include various metallic materials, such as stainless steel, Kovar, copper, iron, carbon steel, titanium and the like, and among these, Kovar is preferable. Accordingly, similar to the bottom member 431, the external force can be accurately transmitted by the force detecting element 41, and it is possible to further reduce the damage due to the external force. In addition, although the configuration material of the lid body 49 may be the same as or different from the configuration material of the bottom member 431, it is preferable that the configuration materials are the same. Accordingly, the external force applied to the package 42 can be accurately transmitted by the force detecting element 41.

Although the shape of the package 42 in a plan view is a quadrangle in the embodiment, the shape is not limited thereto, and another polygon, such as a pentagon, a circle, an ellipse, or the like may be employed.

In the package 42 described above, the bottom surface 4341 of the recess portion 433 has a part made of metal. In particular, as described above, it is preferable that the base portion 43 is made of a metal (particularly, Kovar). Accordingly, mechanical strength, such as brittleness of the bottom surface 4341 can be enhanced.

Furthermore, as described above, the force detecting element 41 that serves as the "force detecting unit" overlaps a part made of metal of the bottom surface 4341 when viewed from a direction in which the force detecting element 41 and the bottom surface 4341 overlap each other (viewed from the direction of arrow A3 in FIG. 4). Accordingly, it is possible to reduce or avoid occurrence of damage, such as cracks, on the bottom surface 4341 due to a load from the force detecting element 41 on the bottom surface 4341.

In addition, as described above, the sensor device 4 has the lid body 49 that serves as the "second member" which closes the opening of the recess portion 433. Accordingly, the force detecting element 41 is accommodated in the space S1 formed by the base portion 43 and the lid body 49, and the space S1 can be airtightly sealed. Therefore, it is possible to reduce deterioration of detection accuracy due to an external factor of the force detecting element 41.

In addition, at least a part of the lid body 49 that serves as the "second member" overlaps the force detecting element 41 when viewed from the direction in which the force detecting element 41 that serves as the "force detecting unit" and the bottom surface 4341 overlap each other (when viewed from the direction of the arrow A3 in FIG. 4). Accordingly, the force detecting element 41 can be disposed between the base portion 43 and the lid body 49. Therefore, it is possible to pressurize the force detecting element 41 from both of the base portion 43 and the lid body 49 by being sandwiched by the wall portions 22 and 33, for example, it is possible to reduce deterioration of robustness. As a result, it is possible to reduce deterioration of detection accuracy of the force detecting element 41.

Side Electrode (Electrode)

In the force detecting element 41, at least one side electrode 45 is provided, and a plurality of side electrodes 45 are provided in the configuration illustrated in FIGS. 4 and 6. As illustrated in FIGS. 4 and 6, a plurality of (four in the embodiment) side electrodes 45 are provided on the side surface of the force detecting element 41. In addition, in the following description, among the four side electrodes 45, the side electrode 45 positioned on the upper left side in FIG. 6 is referred to as "side electrode 45a", the side electrode 45 positioned on the lower left side in FIG. 6 is referred to as "side electrode 45b", the side electrode 45 positioned on the upper right side in FIG. 6 is referred to as "side electrode 45c", and the side electrode 45 positioned on the lower right side in FIG. 6 is referred to as "side electrode 45d". In addition, in a case where each of the side electrodes 45a, 45b, 45c, and 45d is not distinguished, the side electrodes 45a, 45b, 45c, and 45d are referred to as "side electrode 45". In addition, the number of side electrodes 45 is not particularly limited, and may be one.

The side electrode 45a is electrically connected to the output electrode layer 52a of the force detecting element 41. Similarly, the side electrode 45b is electrically connected to the output electrode layer 52b of the force detecting element 41, and the side electrode 45c is electrically connected to the output electrode layer 52c of the force detecting element 41. In addition, the side electrode 45a is electrically connected to the ground electrode layers 54, 55, 56, and 57 of the force detecting element 41. The side electrodes 45a and 45b are provided to be separated from each other on the same side surface of the force detecting element 41. In addition, the side electrodes 45c and 45d are provided to be separated from each other on the same side surface that opposes the side surface on which the side electrodes 45a and 45b are provided. In addition, each of the side electrodes 45a, 45b, 45c, and 45d may be provided on the same surface of the force detecting element 41, or may be provided on different surfaces.

In addition, each of the side electrodes 45 has an elongated shape along the lamination direction D1 of the force detecting element 41. In the embodiment, each of the side electrodes 45 has an elongated shape which extends from the support substrate 58 to the middle of the support substrate 59. In addition, each of the side electrodes 45 can be formed by, for example, a sputtering method, a plating method, or the like. With such a configuration, each of the side electrodes can be easily formed. In addition, examples of the configuration material of each of the side electrodes 45 include nickel, gold, titanium, aluminum, copper, iron and the like, and one type or two or more types of these can be used in combination. In particular, it is preferable that each of the side electrodes 45 is made of a material containing nickel (Ni). Nickel is preferable because nickel has a thermal expansion coefficient close to the thermal expansion coefficients of the piezoelectric layers 51a, 53a, 51b, 53b, 51c, and 53c.

Terminal

In the base portion 43, at least one terminal 47 is provided, and a plurality of terminals 47 are provided in the configuration illustrated in FIGS. 4 and 6. As illustrated in FIG. 4 and FIG. 6, a plurality of (four in the embodiment) terminals 47 are provided in the step portion 4321 of the above-described base portion 43. In addition, in the following description, among the four terminals 47, the terminal 47 positioned on the upper left side in FIG. 6 is referred to as "terminal 47a", the terminal 47 positioned on the lower left side in FIG. 6 is referred to as "terminal 47b", the terminal 47 positioned on the upper right side in FIG. 6 is referred to as "terminal 47c", and the terminal 47 positioned on the lower right side in FIG. 6 is referred to as "terminal 47d". In addition, in a case where each of the terminals 47a, 47b, 47c, and 47d is not distinguished, the terminals 47a, 47b, 47c, and 47d are referred to as "terminals 47". In addition, the number of terminals 47 is not particularly limited, and may be one.

The terminal 47a is provided in the vicinity of the side electrode 45a. Similarly, the terminal 47b is provided in the vicinity of the side electrode 45b, the terminal 47c is provided in the vicinity of the side electrode 45c, and the terminal 47d is provided in the vicinity of the side electrode 45d.

Each of the terminals 47 is electrically connected to the analog circuit board 6 via wirings (not illustrated) provided on the base portion 43 (refer to FIGS. 2 to 4).

In addition, each of the terminals 47 may have conductivity, and may be formed by laminating each film, such as nickel, gold, silver, or copper, on a metallization layer (ground layer), such as chromium, tungsten, or the like.

Connecting Portion

The sensor device 4 includes at least one connecting portion 46, and includes a plurality of connecting portions 46 in the configuration illustrated in FIGS. 4 and 6. As illustrated in FIG. 4, a plurality of (four in the embodiment) connecting portions 46 electrically connect the above-described terminal 47 and the side electrode 45. In addition, in the following description, among the four connecting portions 46, the connecting portion 46 positioned on the upper left side in FIG. 6 is referred to as "connecting portion 46a", the connecting portion 46 positioned on the lower left side in FIG. 6 is referred to as "connecting portion 46b", the connecting portion 46 positioned on the upper right side in FIG. 6 is referred to as "connecting portion 46c", and the connecting portion 46 positioned on the lower right side in FIG. 6 is referred to as a "connecting portion 46d". In addition, in a case where each of the connecting portions 46a, 46b, 46c, and 46d is not distinguished, the connecting portions 46a, 46b, 46c, and 46d are referred to as "connecting portion 46". In addition, the number of connecting portions 46 is not particularly limited, and may be one.

The connecting portion 46a adheres to the side electrode 45a and the terminal 47a, and electrically connects the side electrode 45a and the terminal 47a to each other. Similarly, the connecting portion 46b adheres to the side electrode 45b and the terminal 47b, and electrically connects the side electrode 45b and the terminal 47b to each other. The connecting portion 46c adheres to the side electrode 45c and the terminal 47c, and electrically connects the side electrode 45c and the terminal 47c to each other. The connecting portion 46d adheres to the side electrode 45d and the terminal 47d, and electrically connects the side electrode 45d and the terminal 47d to each other.

In addition, examples of configuration materials of each of the connecting portions 46 include gold, silver, copper, or the like, and one type or two or more types of these can be used in combination. In addition, each of the connecting portions 46 may be specifically formed of, for example, Ag paste, Cu paste, Au paste or the like, but it is particularly preferable to use Ag paste. The Ag paste is easy to obtain and excellent in handleability.

Adhesive Member

As illustrated in FIGS. 4 and 6, the adhesive member 44 is a member having an insulating property, and is provided between the force detecting element 41 and the base portion 43. Specifically, the adhesive member 44 is provided between the bottom surface 4341 of the recess portion 433 and the force detecting element 41, and between the side surface 4342 of the recess portion 433 and the force detecting element 41. In other words, the adhesive member 44 has a part 444 positioned between the bottom surface 4341 of the recess portion 433 and the force detecting element 41, and a part 445 positioned between the side surface 4342 of the recess portion 433 and the force detecting element 41.

The part 444 of the adhesive member 44 overlaps the force detecting element 41 when viewed from the direction of the arrow A3 in FIG. 4 and encloses the force detecting element 41 (refer to FIGS. 4 and 6). Furthermore, the part 444 of the adhesive member 44 also overlaps a part of the adhesive member 44 when viewed from the direction of the arrow A3. In addition, as illustrated in FIG. 7, the part 445 of the adhesive member 44 is not in contact with the connecting portion 46, but is provided with a gap S2 between the connecting portion 46 and the part 445.

In addition, a height T1 of the part 445 is smaller than the total height T2 of the height of the support substrate 59 of the force detecting element 41 and the height of the part 444 of the adhesive member 44. Accordingly, it possible to reduce or prevent the adhesive member 44 from coming into contact with the side electrode 45 or the connecting portion 46 and hindering the conduction between the side electrode 45 and the connecting portion 46.

The adhesive member 44 is made of a member having higher bending strength and flexural modulus than those of the base portion 43 and the force detecting element 41. The bending strength of the adhesive member 44 is approximately 100 MPa or greater and 300 MPa or less, and the bending elastic modulus of the adhesive member 44 is approximately 4000 MPa or greater and about 6000 MPa or less. Since the adhesive member 44 is provided between the force detecting element 41 and the base portion 43, it is possible to further reduce the damage of the force detecting element 41 or the base portion 43 due to an external force.

In addition, the adhesive member 44 is made of a cured product of an adhesive. Examples of the form of the adhesive include a liquid state (including a semi-solid state, such as a paste state) or a solid state in the form of a sheet or a film. Among these, it is particularly preferable to use a liquid adhesive. In other words, it is preferable that the adhesive member 44 is a cured product of a liquid adhesive. Accordingly, when adhering the force detecting element 41 to the base portion 43, it is possible to reduce the generation of bubbles or residual bubbles between the force detecting element 41 and the base portion 43. Therefore, it is possible to reduce deterioration of the adhering strength of the force detecting element 41 with respect to the base portion 43. In addition, the term "liquid state" refers to a state having fluidity at room temperature (25° C.), and the solid state refers to a state having no fluidity at room temperature (25° C.). In addition, for example, a material which flows when the adhesive is disposed to be tilted in a flat plate-like member by self-weight thereof, is made liquid.

In addition, in the embodiment, the adhesive includes a resin material that is capable of performing curing reaction and the filler 442a (first filler) and the filler 442b (second filler) (refer to FIG. 8). In addition, the adhesive may appropriately contain water, a solvent, a plasticizer, a curing agent, an antistatic agent and the like.

As the resin material, it is possible to use a curable resin, such as a thermoplastic resin, a plastic resin (for example, a thermoplastic resin), a thermosetting resin, a photocurable resin, and an electron beam curable resin, and among these, it is preferable to use a curable resin (a resin material that can react to the curing), and it is more preferable to use a thermosetting resin. Examples of the thermosetting resin include acrylic resins, phenolic resins, silicone resin-based resins, epoxy resins and the like, and among these, it is preferable to use epoxy resins. Epoxy resins are particularly excellent in tensile shear adhering strength. Here, in the embodiment, as described above, by sandwiching the force detecting element 41 between the wall portions 22 and 33 via the base portion 43 and the lid body 49, the strength in a direction (lamination direction D1) of pushing the force detecting element 41 of the base portion 43 against the bottom member 431 is guaranteed, but the strength in the shearing direction (z-axis direction) is insufficient. Therefore, as described above, the strength in the shearing direction of the force detecting element 41 can be sufficiently ensured by using an epoxy resin having particularly excellent tensile shear adhering strength.

The content of the resin material in the adhesive is preferably 50% by weight or greater, and more preferably 70% by weight or greater and 95% by weight or less. In addition, in a case where a solvent or water is contained, the above-described content indicates the solid content excluding these.

The filler 442a functions as a gap material that regulates a distance between the force detecting element 41 and the bottom surface 4341 and regulates a thickness D of the adhesive member 44. The maximum diameter (maximum width) of the filler 442a is greater than the maximum diameter (maximum width) of the filler 442b. Accordingly, by using the filler 442a, it is easy to control the thickness D of the adhesive member 44 to a desired thickness.

The filler 442b controls the properties of the resin material. By using the filler 442b, it is possible to adjust the resin viscosity (viscosity of the adhesive member 44 before being cured) of the resin material, and to adjust the mechanical properties after being cured (mechanical properties of the adhesive member 44 after being cured). In particular, it is relatively difficult to adjust the viscosity of the adhesive member 44 before being cured only by the filler 442a, but by using the filler 442b, it is possible to easily adjust the viscosity of the adhesive member 44 before being cured.

As the configuration material of the fillers 442a and 442b, it is preferable to use inorganic fillers containing inorganic oxides, such as silica ($SiO_2$) and alumina ($Al_2O_3$), and inorganic materials, such as ceramics and glass, and one type or two or more types fillers among the materials can be used in combination. Among these materials, in particular, it is preferable to use silica and alumina as the configuration material of the fillers 442a and 442b. Accordingly, the mechanical strength or heat resistance of the adhesive member 44 can be enhanced. In addition, it is preferable that the fillers 442a and 442b have no conductivity (insulating properties). Accordingly, the conductivity of the adhesive member 44 can be further reduced.

As the shape of the fillers 442a and 442b, a spherical shape is preferable, but the shape is not particularly limited thereto, and it is possible to use spherical, rectangular, plate-like, needle-shaped, or leaf-like fillers. By making the fillers 442a, 442b into a spherical shape, classification can be performed, and the size of the diameter can be made uniform. In addition, it is easy to control the adhesive member 44 to a desired thickness D. In addition, the fillers 442a and 442b may be a dense body or a porous body.

In addition, it is preferable that the maximum diameter (maximum thickness) of the filler 442a is equal to or greater than 10 μm, and is more preferable that the maximum diameter is 10 μm or greater and 100 μm or less. Accordingly, it is easy to set the thickness D of the adhesive member 44 to be a desired thickness D (refer to FIG. 8). In other words, it is preferable that the maximum diameter (maximum width) of the filler 442a is equal to the thickness D of the adhesive member 44 to be formed. Accordingly, it is possible to easily form the adhesive member 44 having the desired thickness D. In addition, it is preferable that an average diameter (average width) of the filler 442a is 0.1 μm or greater or 100 μm or less, and is more preferable that the average diameter is 1 μm to 90 μm or less.

In addition, it is preferable that the maximum diameter (maximum width) of the filler 442b is 1 nm or greater or 50 nm or less. Accordingly, it is possible to appropriately adjust the viscosity of the adhesive member 44 before being cured and the mechanical properties of the adhesive member 44 after being cured.

Here, the maximum diameter of the filler 442a is a length of the longest part of the filler 442a. For example, in a case where the shape of the filler 442a is a sphere (spherical shape), the maximum diameter of the filler 442a is a diameter of the sphere, and in a case where the shape of the filler 442a when viewed in a plan view is an ellipse (elliptical shape), the maximum diameter of the filler 442a is a long diameter of the ellipse. In addition, the maximum diameter of the filler 442b is also similar thereto.

The total content of the fillers 442a and 442b in the adhesive is not particularly limited, but it is preferable that the total content is 5% by weight or greater or 40% by weight or less, and is more preferable that the total content is 10% by weight or greater or 30% by weight or less. When the content is higher than the upper limit value, the adhering function of the adhesive member 44 deteriorates. In addition, when the content is lower than the lower limit value, the effects of the fillers 442a and 442b become insufficient. In a case where a solvent or water is contained, the above-described content indicates the solid content excluding these.

In this manner, in the embodiment, the adhesive member 44 includes the fillers 442a and 442b. It is preferable that the adhesive member 44 includes the inorganic filler. Accordingly, it is possible to use the filler 442a configured of the inorganic filler as the cap material that regulates the distance between the force detecting element 41 and the bottom surface 4341, and to enhance the uniformity of the thickness D of the adhesive member 44 positioned between the force detecting element 41 and the bottom surface 4341. In addition, by using the inorganic filler, it is possible to enhance the mechanical strength of the adhesive member 44. Furthermore, it is possible to use the filler 442b configured of the inorganic filler for controlling the characteristics of the resin member, and to maintain the characteristics when initializing. In addition, by using the inorganic filler, it is possible to enhance mechanical characteristics of the adhesive member 44.

It is preferable that the thickness D of the adhesive member 44 which is a cured product of the adhesive is 1 μm or greater or 100 μm or less, and is more preferable that the thickness D is 5 μm or greater or 90 μm. Accordingly, it is possible to sufficiently ensure the adhesive strength, and it is possible to reduce deterioration of the influence of the transmission of the external force.

Here, with reference to FIG. 9, the relationship between the thickness D of the adhesive member 44 and the strain amount of the force detecting element 41 will be described. A line segment L11 in FIG. 9 illustrates a case where the thickness D of the adhesive member 44 is 30 μm, a line segment L12 illustrates a case where the thickness D of the adhesive member 44 is 100 μm, and a line segment L10 illustrates a case where the force detecting element 41 is provided to directly abut against the bottom surface 4341 without interposing the adhesive member 44.

As illustrated in FIG. 9, in a case where the thickness D of the adhesive member 44 is 30 μm, the strain amount (deformation amount) of the force detecting element 41 with respect to the pushing force (the size of the external force) of the force detecting element 41 is set to be a size equivalent to that in a case where the adhesive member 44 is not provided. In other words, in a case where the thickness D is 30 μm, the strain amount is equal to that in a case where the adhesive member 44 is not provided, and a transmission loss of the external force due to the provided adhesive member 44 is small (almost none).

Meanwhile, as illustrated in FIG. 9, in a case where the thickness D of the adhesive member 44 is 100 μm, the strain amount against the pushing force is greater than that in a case where the adhesive member 44 is not provided. This is because the transmission loss of the external force due to the provided adhesive member 44 increases. In addition, when the thickness D exceeds 100 μm, the strain amount further increases.

From the point of view described above, by setting the thickness D within the above-described range, it is possible to suppress an increase in flexibility (elasticity) of the adhesive member 44 due to an increase in thickness of the adhesive member 44, and accordingly, it is possible to reduce the transmission loss of the external force due to the provided adhesive member 44. As a result, even when the adhesive member 44 is provided, an external force can be transmitted to the force detecting element 41 similar to that in a case where the adhesive member 44 is not provided. In addition, when the thickness D of the adhesive member 44 is 100 μm or less, the transmission loss of external force can be made relatively small.

As described above, each of the sensor devices 4 described above includes: a base portion 43 that serves as a "first member" having a recess portion 433; the force detecting element 41 that is installed in the recess portion 433 and serves as a "force detecting unit" including at least one piezoelectric element 5 that outputs a signal in accordance with the external force; and the adhesive member 44 provided between the force detecting element 41 and the bottom surface 4341 of the recess portion 433. According to the force detection device 1, since the force detecting element 41 can adhere to the bottom surface 4341 of the recess portion 433 by the adhesive member 44, the stability of the position in the recess portion 433 of the force detecting element 41 can be enhanced. Therefore, it is possible to reduce deterioration of resistance against mechanical stress, such as vibration. As a result, it is possible to output a signal that corresponds to the external force with high accuracy, and thus, to improve the detection accuracy of the external force.

In addition, in the embodiment, the surface of the force detecting element 41 on the bottom surface 4341 side comes into contact with the adhesive member 44 throughout the entire region thereof. In other words, the adhesive member 44 is provided over the entire area between the force detecting element 41 and the bottom surface 4341. When there is a part at which the adhesive member 44 is not provided in the region between the force detecting element 41 and the bottom surface 4341, the stress is likely to concentrate on the part, but by providing the adhesive member 44 over the entire region between the force detecting element 41 and the bottom surface 4341, local concentration of stress can be reduced or prevented. Therefore, a signal that corresponds to the external force can be output with higher accuracy.

In addition, as illustrated in FIG. 4, the sensor device 4 includes: the side electrode 45 (at least one side electrode 45) that serves as "electrode" provided in the force detecting element 41 that serves as "force detecting unit"; a terminal 47 (at least one terminal 47) provided in the base portion 43 that serves as "first member"; and the connecting portion 46 (at least one connecting portion 46) which electrically connects the side electrode 45 and the terminal 47 to each other. Accordingly, for example, it is possible to electrically connect the force detecting element 41 to the external force detection circuit 60 which calculates the detection result (electric charge) output from the force detecting element 41 via the side electrode 45, the connecting portion 46, and the terminal 47.

In addition, the connecting portion 46 has a part that overlaps the adhesive member 44 when viewed from the direction in which the force detecting element 41 that serves as "force detecting unit" and the bottom surface 4341 overlap each other (when viewed from the direction of the arrow A3 in FIG. 4). Accordingly, it is possible to reduce or prevent the connecting portion 46 from coming into contact with the bottom surface 4341 of the recess portion 433. Therefore, it is possible to prevent a short circuit due to the contact between the conductive base portion 43 and the connecting portion 46.

In particular, as described above, the adhesive member 44 preferably has insulating properties. Accordingly, the connecting portion 46 can be prevented from coming into contact with the bottom surface 4341, and a short circuit caused by the contact between the connecting portion 46 and the bottom surface 4341 can be reduced or prevented. In addition, for example, in addition to the base portion 43, even in a case where the surface of the force detecting element 41 on the base portion 43 side is conductive (for example, in a case where the electrode is provided on the surface of the force detecting element 41 on the base portion 43 side), it is possible to reduce or prevent a short circuit due to contact between the bottom surface 4341 and the force detecting element 41.

As described above, according to the sensor device 4, by a synergistic effect by combining each of the above-described functions, it is possible to improve durability and reliability, and as a result, it is possible to improve detection accuracy.

In addition, as described above, the inorganic filler included in the adhesive member 44 includes the filler 442a (first filler) and the filler 442b (second filler), and the maximum diameter of the filler 442a (first filler) is greater than the maximum diameter of the filler 442b (second filler). Accordingly, it is easy to control the thickness D of the adhesive member 44 to a desired thickness, and to suppress characteristics of the resin material. In other words, the filler 442a functions as the cap material that regulates the distance between the force detecting element 41 and the bottom surface 4341, and by using the filler 442a, it is easy to control the thickness D of the adhesive member 44 to a desired thickness. In addition, by using the filler 442b, it is possible to adjust the viscosity of the adhesive member 44 before being cured and the mechanical characteristics of the adhesive member 44 after being cured.

In addition, as described above, a part of the adhesive member 44 is positioned between the force detecting element 41 that serves as "force detecting unit" and the side surface 4342 of the recess portion 433. Accordingly, it is possible to more stably dispose the force detecting element 41 in the recess portion 433. In addition, since it is possible to reduce or prevent the contact of the connecting portion 46 with the bottom surface 4341, it is possible to reduce or prevent a short circuit due to contact between the connecting portion 46 and the bottom surface 4341.

Furthermore, as described above, the force detecting element 41 that serves as the "force detecting unit" includes the support substrate 59 that serves as the "base material" which supports the piezoelectric element 5 and adheres to the adhesive member 44, and the part 445 of the adhesive member 44 positioned between the force detecting element 41 and the side surface 4342 of the recess portion 433 is positioned closer to the bottom surface 4341 side than the piezoelectric element 5c provided on the support substrate 59. In addition, the height T1 of the part 445 of the adhesive member 44 is smaller than the height T2 (thickness) (refer to FIG. 7). Accordingly, it is possible to reduce or prevent the adhesive member 44 from adhering to the side electrode 45 provided in the force detecting element 41 or the terminal 47 provided on the base portion 43, and to more stably dispose the force detecting element 41 in the recess portion 433.

Pressurizing Bolt (Fixing Member)

The plurality of pressurizing bolts 51 fixes the wall portion 33 and the wall portion 22 in a state of sandwiching the sensor device 4 (more specifically, a plurality of piezoelectric elements 5) by the wall portion 33 of the first case member 3 and the wall portion 22 of the second case member 2 (refer to FIG. 3). Each of the pressurizing bolts 51 is inserted through the through-hole 37 of the wall portion 33 from the wall portion 33 side, and a male screw formed at the tip end portion of the pressurizing bolt 51 is screwed into the female screw hole 26 formed in the wall portion 22. With the plurality of pressurizing bolts 51, the inner wall surface 331 of the first case member 3 and the top surface 231 of the second case member 2 can sandwich and pressurize the force detecting element 41 via the package 42 of the sensor device 4. In addition, by appropriately adjusting a fastening force of each of the pressurizing bolts 51, the pressure of the lamination direction D1 of the piezoelectric element 5 having a predetermined size can be applied as a pressure to the force detecting element 41.

Although not being particular limited, as the configuration material of each of the pressurizing bolts 51, for example, various metal materials can be employed. In addition, the positions of each of the pressurizing bolts 51 and the number of pressurizing bolts 51 are not limited to the positions and the number which are illustrated in the drawings, respectively. In addition, the number of the pressurizing bolts 51 may be one, three or more for one sensor device 4, for example. In addition, the force detecting element 41 including the piezoelectric element 5 is sandwiched between the first case member 3 and the second case member 2 (particularly between the wall portion 33 and the wall portion 22), but not being limited thereto, the force detecting element 41 maybe supported by any other configuration between the first case member 3 and the second case member 2.

Analog Circuit Board

As illustrated in FIG. 2, the analog circuit board 6 is disposed in the space S, that is, between the first case member 3 and the second case member 2. On the analog circuit board 6, a through-hole 61 into which the protruding part 23 of the second case member 2 is inserted, and a through-hole 62 into which each of the pressurizing bolts 51 is inserted, are formed (FIGS. 2 and 3). The analog circuit board 6 is disposed on the center axis A1 side with respect to the sensor device 4 in a state of being inserted into the part 23. Accordingly, the analog circuit board 6 can be provided in the vicinity of the sensor device 4, and the wiring length from the sensor device 4 can be shortened. Therefore, it is possible to contribute to simplifying the structure.

In addition, the analog circuit board 6 is electrically connected to the above-described sensor device 4. Although not illustrated, the analog circuit board 6 includes a charge amplifier (not illustrated) for converting the electric charge Q (QX, QY, and QZ) output from the force detecting element 41 of the sensor device 4 respectively into the voltage V (VX, VY, and VZ). The charge amplifier can be configured to include, for example, an operational amplifier, a capacitor, and a switching element.

Digital Circuit Board

Although not illustrated, the digital circuit board can be provided on the second case member 2, for example. The digital circuit board is electrically connected to the above-described analog circuit board 6. Although not illustrated, the digital circuit board is provided with an external force detection circuit which detects (calculates) the external force based on the voltages VX, VY, and VZ from the analog circuit board 6. The external force detection circuit calculates a translational force component Fx in the x-axis direction, a translational force component Fy in the y-axis direction, a translational force component Fz in the z-axis direction, a rotational force component Mx around the X-axis, a rotational force component My around the Y-axis, and a rotational force component Mz around the Z-axis. The external force detection circuit can be configured to include, for example, an AD converter and an arithmetic circuit, such as a CPU connected to the AD converter.

As described above, the force detection device 1 described above includes the top plate 31 (first base portion); the bottom plate 21 (second base portion); and the sensor device 4 which is an example of the sensor device according to the invention provided between the top plate 31 and the bottom plate 21; and the external force detection circuit 60 that detects the external force based on the signal from the sensor device 4. In the embodiment, as described above, the external force detection circuit 60 is configured of the analog circuit board 6 and the digital circuit board. According to the force detection device 1, since the sensor device 4 is provided, it is possible to detect the external force with higher accuracy.

In addition, the sensor device 4 included in the force detection device 1 can be manufactured as follows.

Manufacturing Method of Sensor Device 4

Figure 10:
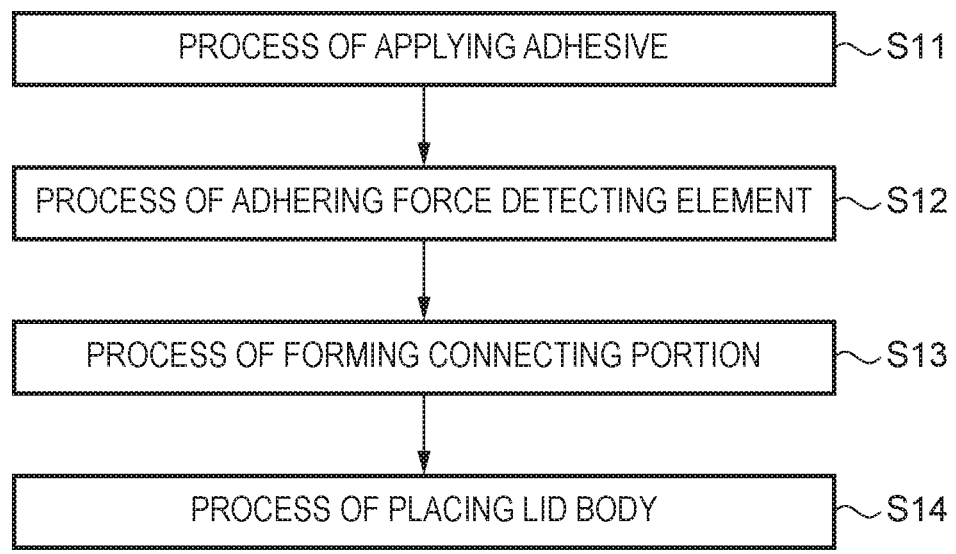
FIG. 10 is a flowchart of a method of manufacturing the sensor device illustrated in FIG. 4.
Figure 11:
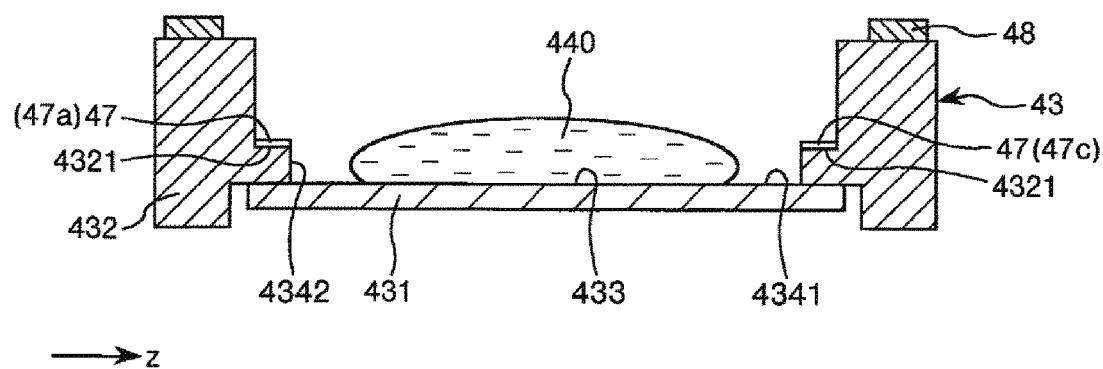
FIG. 11 is a sectional view illustrating a process of applying the adhesive illustrated in FIG. 10.
Figure 12:
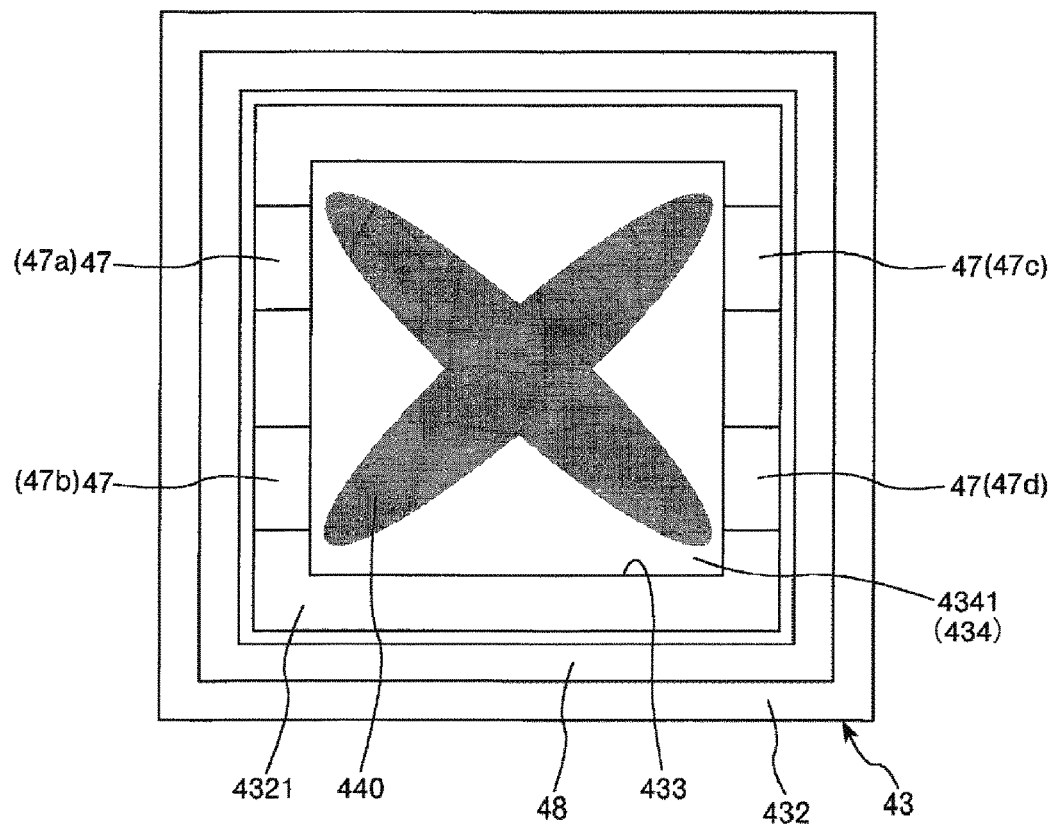
FIG. 12 is a plan view illustrating a process of applying the adhesive illustrated in FIG. 10.
Figure 13:
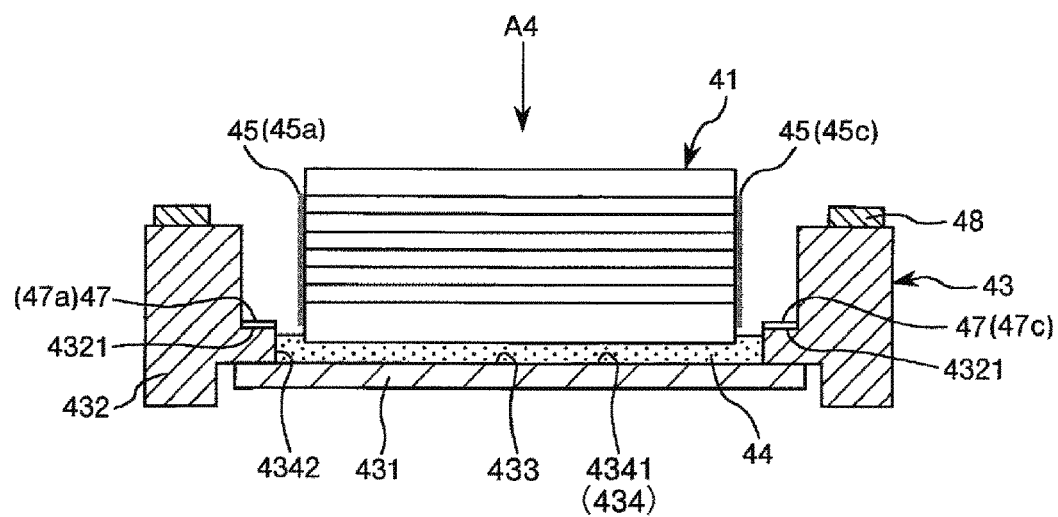
FIG. 13 is a sectional view illustrating a process of adhering the force detecting element illustrated in FIG. 10.
Figure 14:
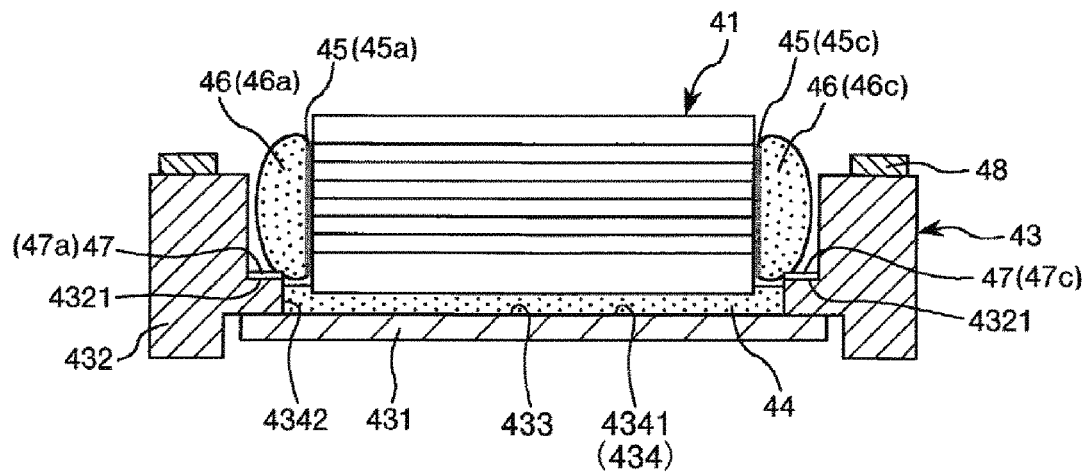
FIG. 14 is a sectional view illustrating a process of forming the connecting portion illustrated in FIG. 10.
Figure 15:
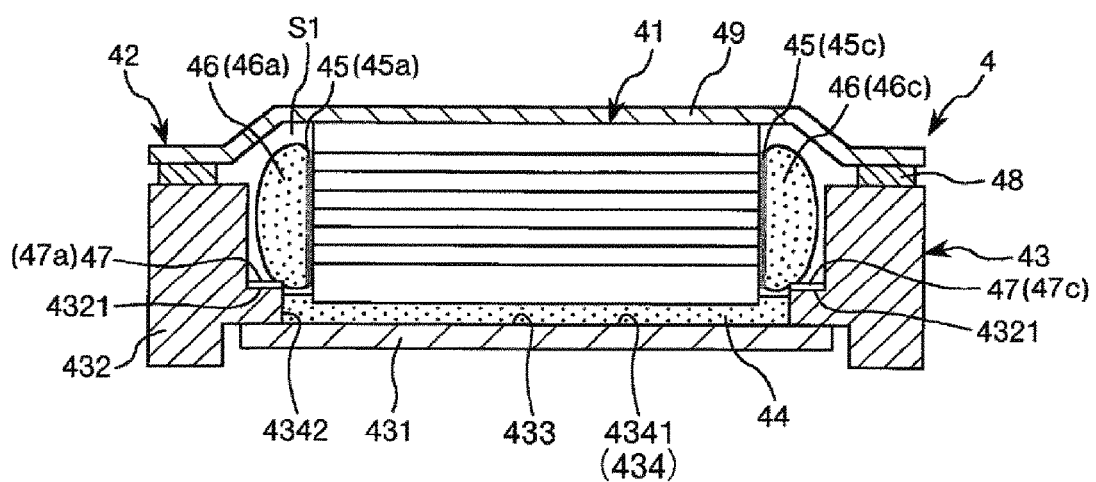
FIG. 15 is a view illustrating a process of placing the lid body illustrated in FIG. 10.

FIG. 10 is a flowchart of a method of manufacturing the sensor device illustrated in FIG. 4. FIG. 11 is a sectional view illustrating a process of applying the adhesive illustrated in FIG. 10. FIG. 12 is a plan view illustrating a process of applying the adhesive illustrated in FIG. 10. FIG. 13 is a sectional view illustrating a process of adhering the force detecting element illustrated in FIG. 10. FIG. 14 is a sectional view illustrating a process of forming the connecting portion illustrated in FIG. 10. FIG. 15 is a view illustrating a process of placing the lid body illustrated in FIG. 10.

As illustrated in FIG. 10, the manufacturing method of the sensor device 4 includes [1] a process of applying the adhesive 440 (step S11), [2] a process of adhering the force detecting element 41 (step S12), [3] a process of forming the connecting portion 46 (step S13), and [4] a process of placing the lid body 49 (step S14). Hereinafter, each process will be described in order.

[1] Process of Applying Adhesive 440 (Step S11)

First, as illustrated in FIGS. 11 and 12, for example, a paste-like adhesive 440 is applied onto the bottom member 431 of the base portion 43. At this time, it is preferable that the adhesive 440 is radially applied, and it is more preferable to apply the adhesive 440 so as to extend from the center portion of the bottom member 431 to the terminal 47. Specifically, as illustrated in FIG. 12, for example, it is preferable to apply the adhesive 440 in a cross shape. Accordingly, when the force detecting element 41 is placed on the adhesive 440 in a later step, it is possible to reduce generation of bubbles or residual bubbles between the force detecting element 41 and the base portion 43. Therefore, it is possible to increase the adhering strength to the bottom surface 4341 of the force detecting element 41. In addition, the uniformity of the thickness D of the formed adhesive member 44 can be enhanced.

In addition, for example, the adhesive 440 may be placed (applied) as a single mass at the center portion of the bottom member 431, or may be disposed in a plurality of dot shapes. In addition, the adhesive 440 may be thinly and uniformly applied on the bottom surface 4341, for example.

[2] Process of Adhering Force Detecting Element 41 (Step S12)

Next, the force detecting element 41 is placed on the adhesive 440, is pressed in the direction of the arrow A4 in FIG. 13, and cures the adhesive 440.

Here, as the adhesive 440, an adhesive (excluding a so-called instantaneous adhesive) having a certain degree of curing time at ordinary temperature (25° C.) or an adhesive cured by applying heat, light, electron beam or the like, is preferable. Accordingly, when the force detecting element 41 is placed on the adhesive 440, the force detecting element 41 can temporarily adhere to the adhesive 440. Therefore, it is easy to adjust the position of the force detecting element 41 in the recess portion 433. In addition, the temporary adhesion refers to a state where the adhesion is in a state of being easily peelable and re-adhesion is possible.

In addition, when positioning is completed in a state of temporary adhesion, pressing in the direction of the arrow A4 as described above is performed to cure the adhesive 440. At this time, since the adhesive 440 has the filler 442a, by pressing the force detecting element 41, it is possible to easily control the distance between the force detecting element 41 and the bottom surface 4341 by the filler 442a that functions as a gap material (refer to FIGS. 8 and 13). In addition, by pressing the force detecting element 41, the adhesive 440 spreads from the center portion of the bottom member 431 to the outer edge portion of the bottom member 431, and rises up between the force detecting element 41 and the side surface 4342 (refer to FIG. 7). Accordingly, as described above, a part of the adhesive 440 can be positioned between the force detecting element 41 and the side surface 4342, and accordingly, the adhering strength of the force detecting element 41 to the base portion 43 can be further enhanced. In addition, it is preferable that the amount of the adhesive 440 is an amount that takes into consideration the gradually rising adhesive 440.

[3] Process of Forming Connecting Portion 46 (Step S13)

Next, a material, such as Ag paste (a base material of the connecting portion 46), is applied and cured between the side electrode 45 and the terminal 47 so as to adhere therebetween. Accordingly, the connecting portion 46 is formed as illustrated in FIG. 14.

Here, as described above, since the force detecting element 41 adheres to the base portion 43 by the adhesive member 44, the relative position of the force detecting element 41 with respect to the base portion 43 is regulated. In other words, the adhesive member 44 functions as a position regulating member. Therefore, when a material, such as Ag paste, is applied so as to link the side electrode 45 and the terminal 47 in the process (step S13), since the position of the force detecting element 41 is not deviated with respect to the base portion 43, a material, such as Ag paste, can be easily applied to a desired location, and workability is high.

[4] Process of Lid Body 49 (Step S14)

Next, the lid body 49 is joined to the base portion 43 via the seal member 48 on the upper surface of the base portion 43. Accordingly, as illustrated in FIG. 15, the sensor device 4 can be obtained.

As described above, the sensor device 4 can be manufactured. According to the method described above, since the position of the force detecting element 41 is regulated by the adhesive member 44, the formation of the connecting portion 46 and the placement of the lid body 49 can be easily performed. Therefore, workability and productivity can be improved.

Next, a modification example of the sensor device 4 will be described.

Figure 16:
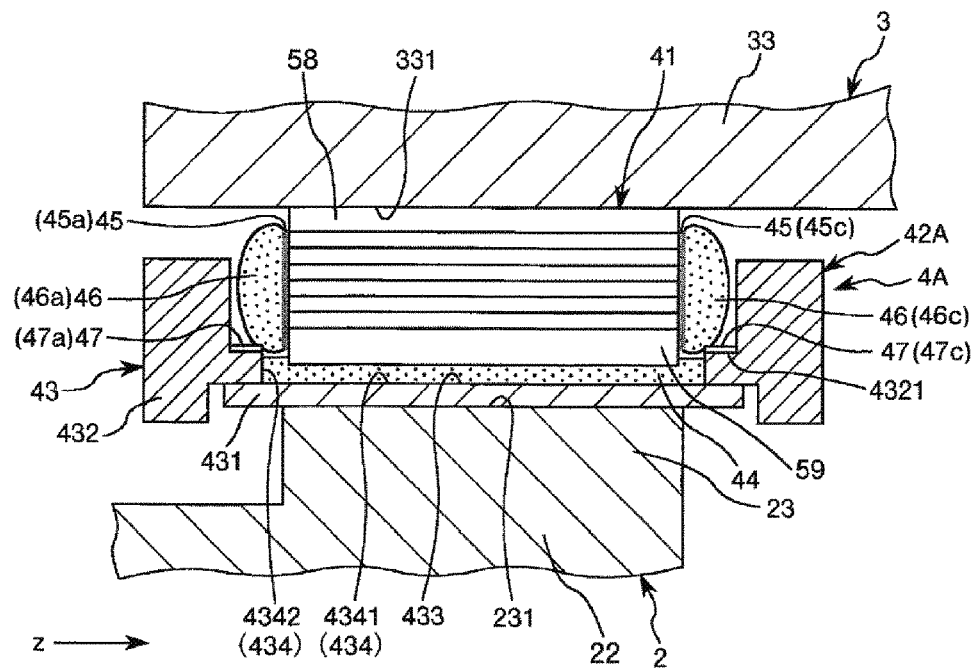
FIG. 16 is a sectional view illustrating a modification example of the sensor device illustrated in FIG. 4.

FIG. 16 is a sectional view illustrating a modification example of the sensor device illustrated in FIG. 4.

As illustrated in FIG. 16, the package 42A of the sensor device 4A does not include the lid body 49 of the sensor device 4. In other words, the "lid body" which covers the opening of the recess portion 433 of the base portion 43 is omitted. In addition, the support substrate 58 of the force detecting element 41 directly abuts against the wall portion 33 of the first case member 3. Even with the sensor device 4A, similar to the above-described sensor device 4, it is possible to enhance the stability of the position in the recess portion 433 of the force detecting element 41 including the adhesive member 44, and to output a signal that corresponds to the external force with high accuracy.

Next, a reference example of the sensor device 4 will be described.

Figure 17:
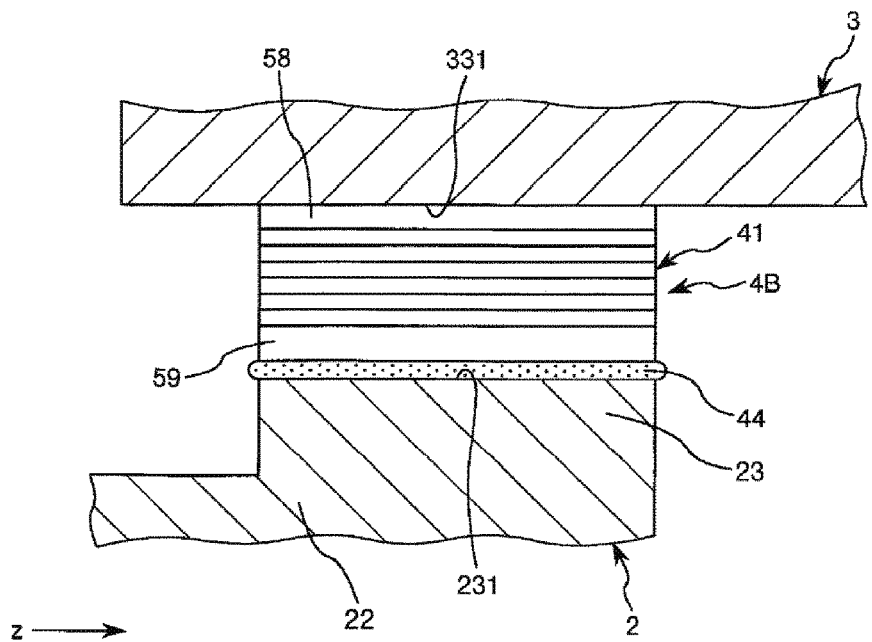
FIG. 17 is a sectional view illustrating the reference example of the sensor device illustrated in FIG. 4.

FIG. 17 is a sectional view illustrating the reference example of the sensor device illustrated in FIG. 4.

As illustrated in FIG. 17, a sensor device 4B does not include the package 42 of the sensor device 4. In addition, the adhesive member 44 directly abuts against the wall portion 22 of the second case member 2. Even with the sensor device 4B, the force detecting element 41 can be stably installed on the wall portion 22 by the adhesive member 44, and accordingly, a signal that corresponds to the external force can be output with high accuracy.

2. Robot

Next, the robot according to the invention will be described.

Figure 18:
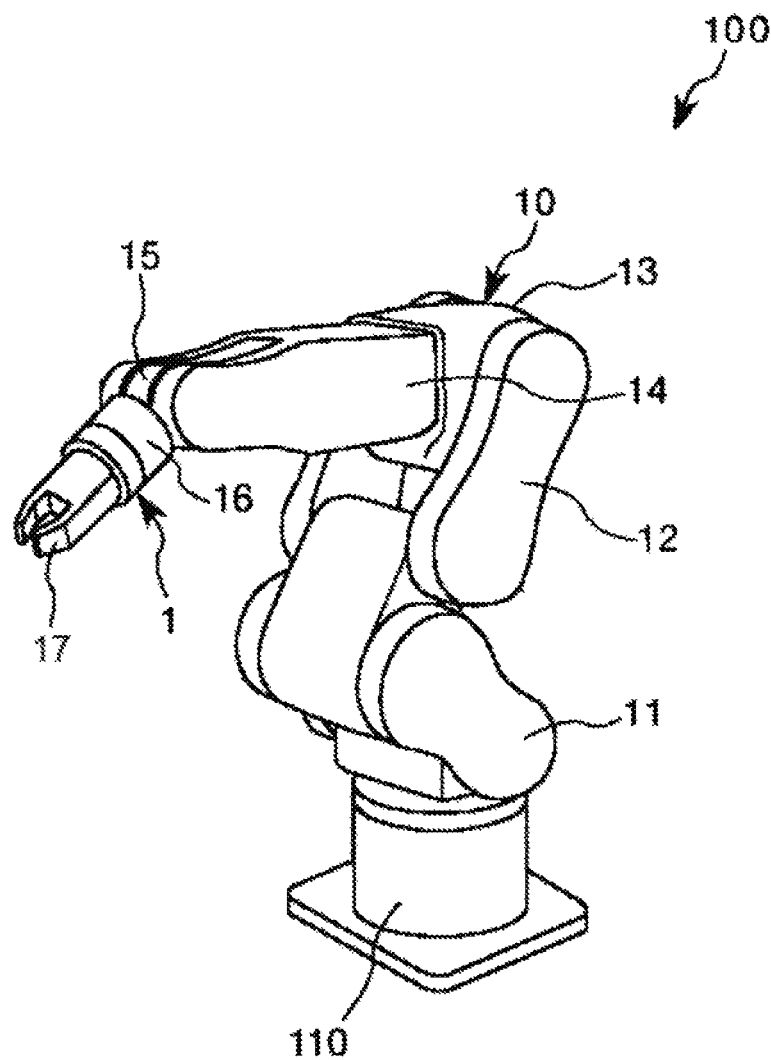
FIG. 18 is a perspective view illustrating an example of a robot according to the invention.

FIG. 18 is a perspective view illustrating an example of the robot according to the invention.

The robot 100 illustrated in FIG. 18 can perform work, such as feeding, removing, transporting and assembling, with respect to the target, such as precision equipment or components that configure the precision equipment. The robot 100 is a single-arm robot, and is a so-called six-axis vertical articulated robot. The robot 100 includes: a support base 110; a robot arm 10 which is linked to the support base 110 to be freely rotatable; the force detection device 1; and the end effector 17.

The support base 110 is, for example, a part fixed to a floor, a wall, a ceiling, and a movable trolley. The robot arm 10 includes an arm 11 (first arm), an arm 12 (second arm), an arm 13 (third arm), an arm 14 (fourth arm), an arm 15 (fifth arm), and an arm 16 (sixth arm). The arms 11 to 16 are linked in this order from the base end side to the tip end side. Each of the arms 11 to 16 is rotatable with respect to an adjacent arm or the support base 110.

The force detection device 1 is connected to the tip end of the arm 16. The force detection device 1 detects the force (including moment) applied to the end effector 17 attached to the tip end of the force detection device 1. The end effector 17 is a tool for performing work with respect to the target that is a work target of the robot 100, and is configured with a hand having a function of gripping the target. In addition, the end effector 17, a tool that corresponds to the work contents or the like of the robot 100 may be used, and not being limited to a hand, for example, a screw fastening tool for screw fastening, a fitting tool for fitting or the like may be employed.

In addition, although not being illustrated, the robot 100 includes a driving unit having a motor or the like that rotates one arm with respect to the other arm (or the support base 110). In addition, although not illustrated, the robot 100 has an angle sensor for detecting the rotation angle of the rotating shaft of the motor.

The robot 100 has the support base 110; the robot arm 10 (arm) connected to the support base 110; and the above-described force detection device 1. According to the robot 100, the force detection device 1 is provided. Therefore, for example, by feeding back the external force detected by the force detection device 1 to a control unit (not illustrated) having a function of controlling the robot 100, the robot 100 can perform the work more precisely. In addition, due to the external force detected by the force detection device 1, the robot 100 can detect contact of the end effector 17 with an obstacle or the like. Therefore, it is possible to easily perform an obstacle avoiding operation, a target damage avoiding operation and the like, and the robot 100 can execute the work more safely.

Above, the sensor device, the force detection device, and the robot according to the invention is described based on the illustrated embodiments, but the invention is not limited thereto, and the configurations of each part may be replaced with other configurations having similar functions. In addition, any other configurations may be added to the invention.

In addition, the force detection device may be provided between the arm and the arm (attached member). In addition, the lamination direction of the piezoelectric element is not limited to that illustrated in the drawing. In addition, the pressurizing bolt may be provided as necessary, and may be omitted.

In addition, the robot according to the invention may be another robot, such as a scalar robot. In addition, although the number of arms of the robot 100 is six in the drawing, the invention is not limited thereto and may be 1 to 5 or 7 or more.

In addition, the robot according to the invention is not limited to a single arm robot as long as the robot has an arm, and may be another robot, such as a dual arm robot. In other words, the number of robot arms is not limited to one, and may be two or more.

In addition, the sensor device and the force detection device according to the invention can also be incorporated in devices other than the robot, and may be mounted on a moving object, such as an automobile.

The entire disclosure of Japanese Patent Application No. 2017-041359, filed Mar. 6, 2017, and No. 2018-007032, filed Jan. 19, 2018 are expressly incorporated by reference herein.

What is claimed is:

1. A sensor device, comprising:
   a base having a recess;
   a force detecting element which is provided in the recess, and includes at least one piezoelectric element that outputs a signal in accordance with an external force;
   an adhesive which is provided between the force detecting element and a bottom surface of the recess, and has insulating properties;
   at least one electrode provided in the force detecting element;
   at least one terminal provided in the base; and
   at least one conductive paste which electrically connects the electrode and the terminal to each other,
   wherein the conductive paste has a part that overlaps the adhesive when viewed from a direction in which the force detecting element and the bottom surface overlap each other,
   wherein the bottom surface has a part made of metal, and
   wherein the force detecting element overlaps the part made of the metal on the bottom surface when viewed from the direction in which the force detecting element and the bottom surface overlap each other.

2. The sensor device according to claim 1, wherein the adhesive includes inorganic fillers.

3. The sensor device according to claim 2, wherein the inorganic filler includes a first filler and a second filler, and
   wherein the maximum diameter of the first filler is greater than the maximum diameter of the second filler.

4. The sensor device according to claim 1, wherein a part of the adhesive is positioned between the force detecting element and a side surface of the recess.

5. The sensor device according to claim 4, wherein the force detecting element has a base material which supports the piezoelectric element and adheres to the adhesive, and
   wherein the part positioned between the force detecting element of the adhesive and the side surface of the recess is positioned closer to the bottom surface side than the piezoelectric element provided on the base material.

6. The sensor device according to claim 5, further comprising:
   a lid which blocks an opening of the recess.

7. The sensor device according to claim 6, wherein at least a part of the lid overlaps the force detecting element when viewed from the direction in which the force detecting element and the bottom surface overlap each other.

8. The sensor device according to claim 7, wherein the piezoelectric element includes quartz crystal.

9. A force detection device comprising:
   a first board;
   a second board;
   the sensor device provided between the first board and the second board; and
   an external force detection circuit which detects the external force based on the signal from the sensor device,
   wherein the sensor device includes:
   a base having a recess;
   a force detecting element which is provided in the recess, and includes at least one piezoelectric element that outputs a signal in accordance with an external force;
   an adhesive which is provided between the force detecting element and a bottom surface of the recess, and has insulating properties;
   at least one electrode provided in the force detecting element;
   at least one terminal provided in the base; and
   at least one conductive paste which electrically connects the electrode and the terminal to each other,
   wherein the conductive paste has a part that overlaps the adhesive when viewed from a direction in which the force detecting element and the bottom surface overlap each other,
   wherein the bottom surface has a part made of metal, and
   wherein the force detecting element overlaps the part made of the metal on the bottom surface when viewed from the direction in which the force detecting element and the bottom surface overlap each other.

10. The force detection device according to claim 9, wherein the adhesive includes inorganic fillers.

11. The force detection device according to claim 10, wherein the inorganic filler includes a first filler and a second filler, and
    wherein the maximum diameter of the first filler is greater than the maximum diameter of the second filler.

12. The force detection device according to claim 9, wherein a part of the adhesive is positioned between the force detecting element and a side surface of the recess.

13. The force detection device according to claim 12, wherein the force detecting element has a base material which supports the piezoelectric element and adheres to the adhesive, and
    wherein the part positioned between the force detecting element of the adhesive and the side surface of the recess is positioned closer to the bottom surface side than the piezoelectric element provided on the base material.

14. The force detection device according to claim 13, further comprising:
    a lid which blocks an opening of the recess.

15. The force detection device according to claim 14, wherein at least a part of the lid overlaps the force detecting element when viewed from the direction in which the force detecting element and the bottom surface overlap each other.

16. The force detection device according to claim 9, wherein the piezoelectric element includes quartz crystal.

17. A robot comprising:
    a support base;
    an arm which is connected to the support base; and
    the force detection device,
    wherein the force detection device includes:
    a first board;
    a second board;
    the sensor device provided between the first board and the second board; and
    an external force detection circuit which detects the external force based on the signal from the sensor device,
    wherein the sensor device includes:
    a base having a recess;
    a force detecting element which is provided in the recess, and includes at least one piezoelectric element that outputs a signal in accordance with an external force;
    an adhesive which is provided between the force detecting element and a bottom surface of the recess, and has insulating properties;

at least one electrode provided in the force detecting element;

at least one terminal provided in the base; and at least one conductive paste which electrically connects the electrode and the terminal to each other, wherein the conductive paste has a part that overlaps the adhesive when viewed from a direction in which the force detecting element and the bottom surface overlap each other, wherein the bottom surface has a part made of metal, and wherein the force detecting element overlaps the part made of the metal on the bottom surface when viewed from the direction in which the force detecting element and the bottom surface overlap each other.

18. The robot according to claim 17,
wherein the adhesive includes inorganic fillers.

19. The robot according to claim 18,
wherein the inorganic filler includes a first filler and a second filler, and
wherein the maximum diameter of the first filler is greater than the maximum diameter of the second filler.

20. The sensor device according to claim 17,
wherein a part of the adhesive is positioned between the force detecting element and a side surface of the recess.

* * * * *